US 6,526,535 B1

(12) United States Patent
Warren

(10) Patent No.: US 6,526,535 B1
(45) Date of Patent: Feb. 25, 2003

(54) SYNCHRONOUS DATA ADAPTOR

(75) Inventor: Robert Warren, Bristol (GB)

(73) Assignee: STMicroelectronics Limited, Almondsbury (GB)

( * ) Notice: Subject to any disclaimer, the term of this patent is extended or adjusted under 35 U.S.C. 154(b) by 0 days.

(21) Appl. No.: 09/507,829

(22) Filed: Feb. 22, 2000

(30) Foreign Application Priority Data

Mar. 29, 1999 (GB) .............................................. 9907254

(51) Int. Cl.$^7$ .............................................. G01R 31/28
(52) U.S. Cl. ...................................................... 714/727
(58) Field of Search ................................ 714/724, 726, 714/30, 56, 43, 727

(56) References Cited

U.S. PATENT DOCUMENTS

| | | | |
|---|---|---|---|
| 5,056,093 A | 10/1991 | Whetsel | 714/729 |
| 5,390,190 A | 2/1995 | Nanda et al. | 714/727 |
| 5,579,322 A | 11/1996 | Onodera | 714/730 |
| 5,590,354 A | * 12/1996 | Klapproth et al. | 714/30 |
| 6,085,344 A | * 7/2000 | Whetsel, Jr. et al. | 714/726 |
| 6,427,216 B1 | * 7/2002 | El-kik et al. | 714/726 |

FOREIGN PATENT DOCUMENTS

| | | | | |
|---|---|---|---|---|
| EP | 0652516 A1 | * | 5/1995 | G06F/11/00 |
| EP | 0840217 A1 | * | 6/1998 | G06F/11/00 |
| WO | WO 98/26301 | | 6/1998 | G01R/31/3185 |

OTHER PUBLICATIONS

Chein–Chung et al., A Real–Time TMS320C40 Based Parallel System for High Rate Digital Signal Processing, 1991, IEEE, p. 15731576.*

* cited by examiner

Primary Examiner—Albert Decady
Assistant Examiner—Shelly A Chase
(74) Attorney, Agent, or Firm—Wolf, Greenfield & Sacks, P.C.; James H. Morris; Robert A. Skrivanek, Jr.

(57) ABSTRACT

An integrated circuit including serial data input and output pins, on-chip functional circuitry and test logic, a test access port controller, and a data adaptor. The test access port controller is connected to effect communication of serial data across tile chip boundary via the input and output pins and is connectable to the test logic to effect communication of serial test data off-chip. The data adaptor is connectable to the input and output pins via the test access port controller. The data adaptor includes an interface for communicating data in the form of serial bits with the test access port controller under control of a first clock signal, and an interface for communicating data in the form of successive sets of parallel data and control signals with the on-chip functional circuitry under control of a second clock signal that is generated independently of the first clock signal. The data adaptor also includes a data store for holding data received in it to take into account differences between the first and second clock signals.

8 Claims, 11 Drawing Sheets

SYNCHRONOUS DATA ADAPTOR

FIELD OF THE INVENTION

This invention relates to an integrated circuit, and particularly an integrated circuit which includes a test access port controller (TAP) for effecting communication of serial data across the chip boundary.

BACKGROUND OF THE INVENTION

An integrated circuit which includes a test access port controller is disclosed in EP-A-0840217. This document discloses an integrated circuit comprising a serial data input pin and a serial data output pin, on-chip functional circuitry and test logic, a test access port controller connected to effect communication of serial data across the chip boundary via said input and output pins, the test access port controller being connectable to the test logic in a first mode of operation to effect communication of serial test data under the control of an incoming clock signal, a data adaptor which is connectable to the input and output pins via the test access port controller in a second mode of operation, wherein in the second mode of operation the data adaptor is supplied with parallel data and control signals from said on-chip functional circuitry and converts said parallel data and control signals into a sequence of serial bits including flow control bits and data bits for communicating off-chip via the test access port controller under the control of said incoming clock signal, said data adaptor receiving from off-chip via the serial data input pin a sequence of serial bits including flow control bits and data bits for conversion into parallel data and control signals for said on-chip functional circuitry.

The data adaptor of this integrated circuit device is intended for use with on-chip logic such as a message converter in order to observe and control the on-chip resources associated with any on-chip functional circuitry, including for example a processor. The parallel connections referred to between the data adaptor and the on-chip functional circuitry represent asynchronous interfaces between the data adaptor and the message converter. These interfaces have hitherto been asynchronous because the data adaptor and the message converter are operated under separate timing environments. Since the data adaptor and message converter are in separate clock environments, synchronisers are generally provided where the interface control signals cross clock boundaries. The accumulated delay of the synchronisers and the overheads of a safe protocol generally limit the maximum data transfer rate to 1 data transfer per 8 or so clock cycles for a byte wide parallel interface. In addition, synchronisation is usually implemented by a series of suitable storage elements, such as flip-flops, which elements are expensive in terms of the chip area consumed by the flip-flop circuits. The overall result is that the asynchronous interface between the data adaptor and the message converter imposes a limit on the maximum data transfer rate or bandwidth limitation in each direction and necessitates the inclusion of synchronisation circuitry which occupies large proportions of the chip area.

Thus it is an object of the present invention to provide a system which removes this limitation on data transfer rate.

SUMMARY OF THE INVENTION

According to an aspect of the present invention there is provided an integrated circuit comprising a serial data input pin and a serial data output pin, on-chip functional circuitry and test logic, a test access port controller connected to effect communication of serial data across the chip boundary via said input and output pins, the test access port controller being connectable to the test logic in a first mode of operation to effect communication of serial test data off-chip, and a data adaptor which is connectable to the input and output pins via the test access port controller in a second mode of operation, wherein the data adaptor comprises a first interface for communicating data in the form of serial bits to and from said test access port controller under the control of a first clock signal and a second interface for communicating data in the form of successive sets of parallel data and control signals to and from said on-chip functional circuitry under the control of a second clock signal generated independently of said first clock signal, and wherein said data adaptor comprises data storage means for holding data received in the data adaptor to take into account differences between the first and second clock signals.

According to a second aspect of the present invention there is provided a computer system comprising an integrated circuit including a target processor connected to an on-chip bus system, functional circuitry connected to said on-chip bus system, a test access port controller connected to serial data input and serial data output pins for effecting communication of serial data across the chip boundary, and a data adaptor which is connectable to the input and output pins via the test access port controller, wherein the data adaptor comprises a first interface for communicating data in the form of serial bits to and from said test access port controller under the control of a first clock signal and a second interface for communicating data in the form of successive sets of parallel data and control signals to and from said on-chip functional circuitry under the control of a second clock signal generated independently of said first clock signal, and wherein said data adaptor comprises data storage means for holding data received in the data adaptor to take into account differences between the first and second clock signals, an off-chip host processor operable to generate and receive parallel data and control signals, and an off-chip data adaptor connected to the host processor to receive said parallel data and control signals from said host processor and to convert them into a sequence of serial bits for transmission onto the chip via the serial data input pin, and to receive a sequence of serial bits from the serial data output pin and to convert said sequence into parallel data and control signals from the off-chip host processor, whereby the host processor can communicate with said additional functional circuitry via said on-chip bus systems without involvement of the target processor.

Preferably, said data storage means comprises a receive data store operable to store data received from off-chip via said test access port controller and supply said data in the direction of said on-chip functional circuitry under the control of said second clock signal and/or a transmit data store to store data transmitted from said on-chip functional circuitry and received by said data storage means under the control of said second clock signal.

In preferred embodiments the or each data store comprises a dual port memory having a plurality of addressable storage locations, first memory access circuitry operating under the control of said first clock signal and second memory access circuitry operating under the control of said second clock signal.

Other embodiments comprise a data adaptor including two simple storage elements which assist the transfer of control and data signals in on-chip and off-chip directions, respectively. While affording fewer of the transfer rate and bandwidth advantages of the invention these embodiments provide significant design freedom in respect of various construction modules of the chip. Thus, communication across the boundary of the integrated circuit can be achieved selectively between the off-chip host processor and the functional circuitry on-chip, preferably without involving a target processor on-chip. This is particularly useful in a diagnostic environment.

In particular, embodiments allow software running on the target processor to be monitored in real time, because communication on and off-chip to the host processor can be done without interrupting real time operation of the target processor. Moreover, the use of the TAP controller and its existing serial input data pin and output data pin saves chip area and overhead in effecting the off-chip communications. The data adaptor serves to modify the parallel format of data and control signals on-chip to a serial format capable of communication via the input and output pins of the TAP controller.

For a better understanding of the present invention and to how the same may be carried into effect, reference will now be made by way of example to the accompanying drawings in which:

DESCRIPTION OF THE PREFERRED EMBODIMENTS

Figure 1:
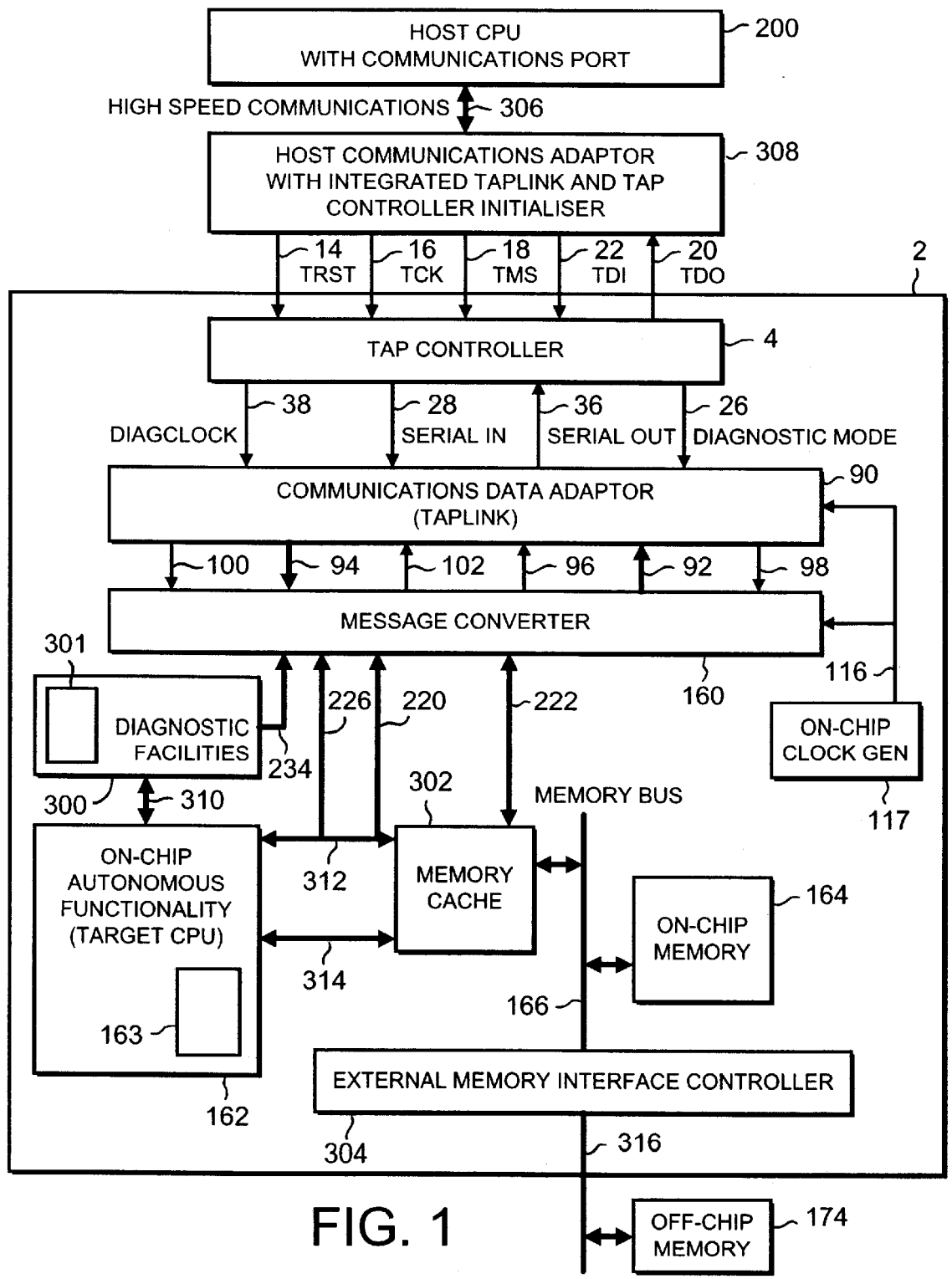
FIG. 1 is a block diagram illustrating the system environment.

Referring to FIG. 1, there is illustrated in schematic form the interconnection between a data adaptor 90 with on-chip destination/source logic such as a target CPU 162, and a host CPU 200. The integrated circuit 2 comprises a TAP controller 4, a data adaptor 90, a target CPU 162 including CPU registers 163, and an on-chip memory 164. Additionally the integrated circuit 2 of FIG. 1 comprises diagnostic facilities 300 including diagnostic registers 301, a memory cache 302, an external memory interface controller 304, and a message converter 160. In FIG. 1, it is shown that the host CPU 200 interfaces with the TAP controller 4 of the integrated circuit 2 via a host communications adaptor 308. The host communications adaptor 308 includes, in the described embodiment, a TAP controller initialiser, a data adaptor, and a memory bus adaptor. In addition the host communications adaptor 308 includes a message converter equivalent to the message converter 160 provided on the integrated circuit 2 for converting messages to and from the host CPU 200. It can be seen that the data adaptor 90 communicates with the diagnostic facilities 300, via message converter 160 and the diagnostic bus 234. The diagnostic facilities 300 and target CPU 162 communicate with each other via a bus 310. The memory monitor bus 226 and memory slave bus 220 of the message converter 160 are both connected to a common bus 312 between the target CPU 162 and the memory cache 302. Additionally the target CPU and memory cache 302 are interconnected via a CPU instruction-fetch bus 314. The memory master bus 222 on the message converter 160 is connected to the memory cache 302, which in turn is connected to the memory bus 166 of the on-chip destination/source logic. The memory bus 166 is connected to the on-chip memory 164. Additionally the memory bus 166 is connected to the external memory interface controller 304, which interfaces the on-chip destination/source logic memory bus 166 to an off-chip memory bus 316 which interfaces with the off-chip memory 174.

When the TAP controller 4, which is described in detail in EP-A-0840134, is in a diagnostic mode, the structure of FIG. 1 can be used to implement various diagnostic procedures by transmitting messages between the on-chip destination/source logic and the host CPU 200.

The diagnostic bus 234 allows reading from and writing to the diagnostic registers 301 of the diagnostic facilities 300, and also allows triggered events to be read. Control information associated with the target CPU is read from the diagnostic registers 300. The instruction pointer and other control signals associated with the target CPU are stored in the diagnostic register 301 of the diagnostic facilities 300. The instruction pointer is continually copied into one of the diagnostic registers 301, and can be accessed by a request on the diagnostic bus 234. To look at the status of the target CPU it is necessary to look at one of the diagnostic registers 301 of the diagnostic facilities 300. The diagnostic registers 301 can store various control signals of the target CPU, for example STORE, TRAP, TAKE A TRAP, TRAP AT NEXT INSTRUCTION. These signals are communicated to the CPU via specific wires.

The host CPU may write to registers within the diagnostic facilities 300 via the diagnostic bus 234, in the same manner as the host CPU may write to memory locations within the target CPU memory space via the memory master bus 222 as discussed hereinabove. In response to the host CPU writing to the registers of the diagnostic facilities 300, triggered events may occur. Such triggered events are detected in the message converter 160 by identifying a request signal associated with a reason code identifying the triggered event. In response to the request signal the message converter 160 loads the reason code associated with the triggered event together with the two bits 11 identifying a triggered header byte. The triggered header byte is then output on the transmit data bus TXDATA to the target CPU.

As mentioned hereinabove, the target CPU can itself access the diagnostic facilities 300 via the memory monitor bus 226 and the diagnostic bus 234. Similarly, if the target CPU writes to the diagnostic facilities, and in response to such a write a triggered event occurs, then the message converter 160 will output the triggered header byte contained in the header register 240 back to the target CPU. The state machine 252 stores whether a write on the diagnostic bus 234 has been made by the target CPU or the host CPU, and returns the triggered event to the correct destination accordingly.

The data adaptor 90 according to the described embodiment implemented in the environment shown in FIG. 1 enables serial data received from the TAP controller 4 to be transmitted in the direction of on-chip functional circuitry as parallel data and control signals. Thus, the data adaptor 90 supports a variety of high level diagnostic features, including boot from test access ports, hot plug insertion, and host and target synchronisation. Note that the data adaptor 90 is supplied with the DIAG_CLK signal on line 38, which is generated off-chip and the SYS_CLK signal on line 116, which is generated on-chip by the clock generator 117.

The message converter, which is described in detail in EP-A-0840218, provides for communication between a host CPU and on-chip destination/source logic via a restricted pin count. Such a converter may have access to a variety of on-chip resources. Some of these may simply be monitored, others may be controlled or both monitored and controlled. Monitoring of any resource is non-intrusive, and has no impact on the performance or latency of the functionality of the chip. This is ideal for diagnostic purposes. The message converter performs the functions of interpretation of received messages, the compilation of transmit messages, and the selection or direction of information to/from the on-chip destination/source logic. The message converter operates independently of any of the on-chip functionality and is therefore non-intrusive, until or unless it is directed to perform some intrusive operation.

The TAP controller 4 is a synchronous finite state machine defined by IEEE Standard 1149.1-1990. That IEEE Standard defines test logic which can be included in an integrated circuit to provide standardised approaches to testing and interconnections between integrated circuits, testing the integrated circuit itself, and observing or modifying circuit activity during the integrated circuits normal operation.

During normal operation of the integrated circuit 2, the TAP controller 4 is in a reset state, and all of its inputs and outputs are inactive. When a test using the test access port according to IEEE Standard 1149.1-1990 is to be performed, the test access port controller operates according to the definitions of that standard. In such a test mode the test access port controller 4 must be able to select at least one test mode of operation. One possible test mode is a scan test mode in which scan data is clocked into a scan chain on-chip and then that data or alternative resultant data is clocked out for checking.

In the described embodiment, the TAP controller can also operate in a diagnostic mode of operation for carrying out diagnostic procedures of source/destination logic on-chip. In the diagnostic mode the TAP controller 4, whilst continuing to provide all normal functionality, additionally acts as a transport agent carrying full duplex, flow-controlled, unbounded, serial data, although the TAP controller is unaware that this is the form of the data. Conversely in scan test mode the TAP controller normally handles a single stream of data, without any flow control, passing through a selected scan chain. In diagnostic mode, the communication of diagnostic data may include memory access requests from host to target and target to host (reads and writes); status information of CPU registers; data read from host memory or target memory in response to a memory access request; status data for loading into CPU registers; and information about memory addresses being accessed by the target CPU.

Thus, the diagnostic mode may involve non-intrusive monitoring of data, or intrusive loading of data. In the diagnostic mode, the serial data shifted into the test access port is a uni-directional serial data stream which can be encoded in any desired means, for example, with start and stop bits to delineate data chunks. Likewise, data shifted out via the test access port is a uni-directional serial data stream which can be encoded in any desired means, for example with start and stop bits to delineate data chunks. Normally the data shifted in and the data shifted out will be encoded in the same way. The input and output uni-directional data streams may be used simultaneously to allow full-duplex, bidirectional, serial communications. The sequence of serial data bits could constitute a byte of information.

The data adaptor 90 according to the described embodiment implemented in the environment shown in FIG. 1 enables a variety of high level diagnostic features to be supported, including boot from test access ports, hot plug insertion, and host and target synchronisation.

Figure 2A:
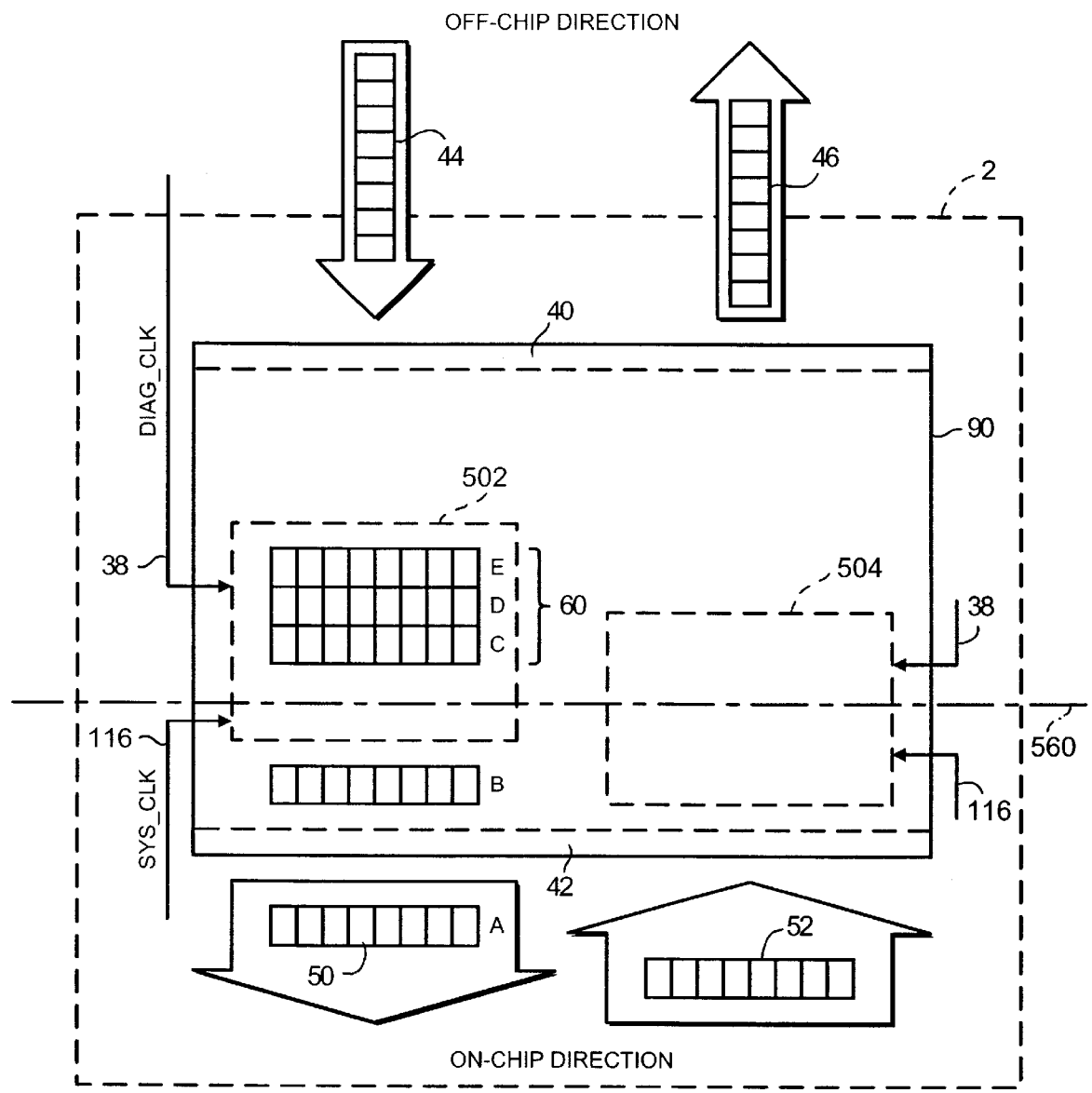
FIG. 2a is a schematic illustrating the operation of a preferred data adaptor.
Figure 2B:
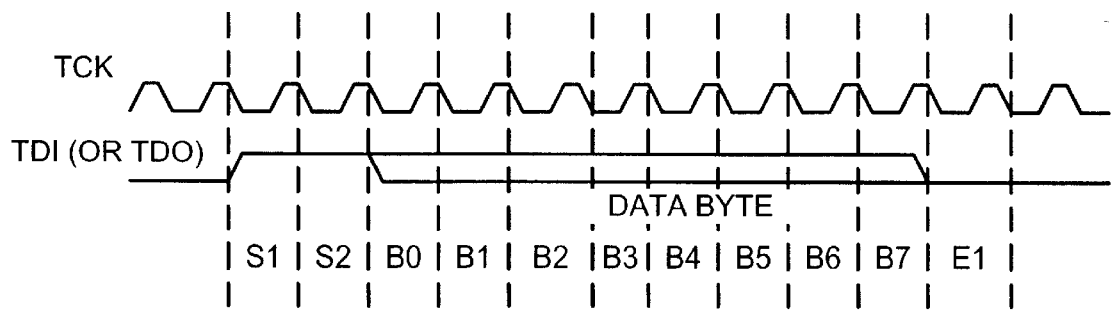
FIG. 2b is a preferred data format for communicating data off-chip via a test access port controller in a diagnostic mode of operation.

FIG. 2a schematically illustrates the function of the data adaptor 90. The data adaptor has a first interface 40 for communicating serial data comprising serial bit streams 44 and 46 to and from off-chip functional circuitry via a TAP controller (not shown in FIG. 2). To provide serial encoding between the TAP controller 4 and the data adaptor 90 the incoming and out going serial bit streams 44,46 comprise start and stop bits as shown in FIG. 2 (b). The bit flow control protocol is return to zero (RTZ) signalling with two start bits S1, S2, and a stop bit E1, including a byte of data therebetween. Serial data in this format is passed from the test data input TDI of the TAP controller to the line 28 and input to the data adaptor 90. Flow control is provided via the "ACK" code which in this example comprises a single start bit followed by a single stop bit transferred in the opposite direction to the data flow. Receive control logic of the data adaptor receives the serial data signal. When the receive control signal recognises two successive serial bits as being the start bits S1 and S2, a receive shift register is controlled to serially load the next eight successive bits, which form a data byte, as will be described hereinafter.

Referring back to FIG. 2a the data adaptor 90 is provided with a second interface 42 for communicating parallel data and control signals 50,52 to and from on-chip functional circuitry. In this example, the parallel data and control signals 50,52 are represented as data bytes each comprising eight bits of data. Within the data adaptor 90, a receive storage block 502 is provided on the receive data path between incoming serial data stream 44 and outgoing parallel data and control signals 50. The storage block 502 is supplied with the DIAG_CLK signal on line 38 which originates off-chip and the SYS_CLK signal on line 116 which originates on-chip. Thus, the storage block 502 lies on a boundary between two timing environments, which boundary may be envisaged as the broken line indicated by reference numeral 560.

The receive storage block 502 of the data adaptor 90 is operable to temporarily store incoming serial data bits 44 in one or more data storage locations 60 until the data is transferred further on-chip, for example to a message converter or other on-chip functional circuitry. Thus, successive sets of data A–E can be transferred from the off-chip timing environment into the on-chip timing environment at a rate which is substantially independent of the time taken to accumulate the number of bits which constitute each data set. In this case one data byte 50 can be transferred from the off-chip timing environment to the on-chip timing environment on each clock cycle.

Figure 2C:
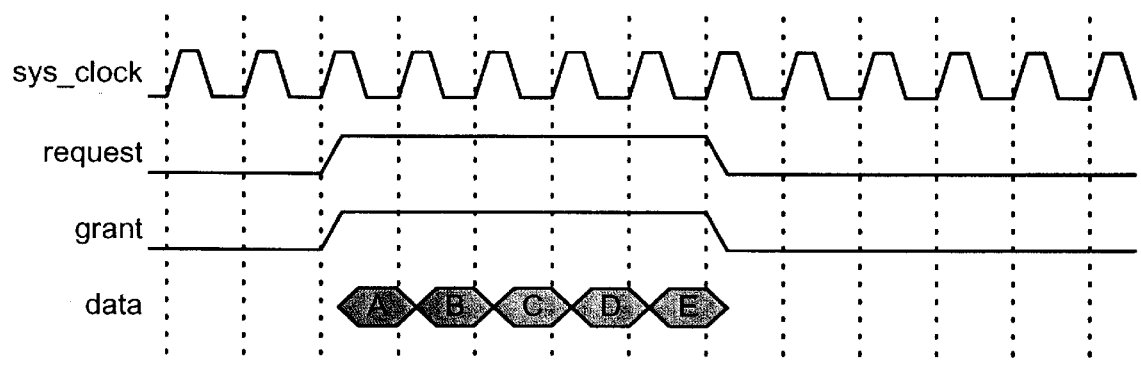
FIG. 2c is a timing diagram illustrating how preferred embodiments of the data adaptor communicate parallel data further on-chip.

FIG. 2c is a timing diagram which illustrates the theoretical maximum data transfer rate for a data adaptor having an 8 bit wide bus at its on-chip interface 42. From FIG. 2b it will be apparent that one of the data bytes A–E is transferred from the off-chip timing environment to the on-chip timing environment on the rising edge of each cycle of the on-chip timing signal SYS_CLK. Thus in the example given, a total of 5 bytes (40 bits) are transferred during the time period spanning 5 clock cycles.

An optional transmit storage block 504, (shown in broken lines in FIG. 2a) corresponding to 502 may be provided within the data adaptor 90 on the transmit path between the incoming parallel data and control signals 52 and the outgoing serial bit stream 46.

Figure 3:
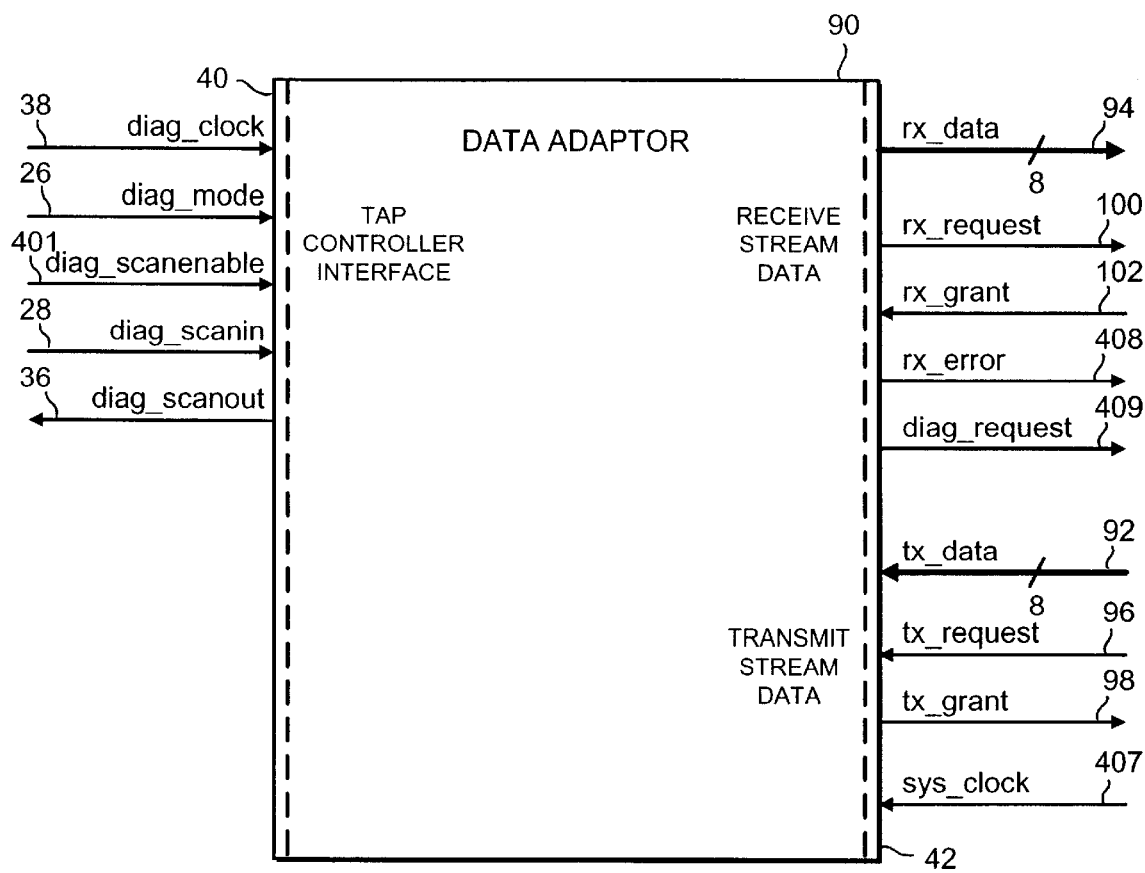
FIG. 3 is a schematic illustrating signals transferred to and from a preferred data adaptor.

FIG. 3 is a schematic summarising the interface groups of the preferred data adaptor 90. The data adaptor 90 receives as inputs from the TAP controller 4 two main signal groups. The first signal group received at this interface represents the TAP controller in diagnostic mode and includes the DIAG_CLOCK signal on line 38, the DIAGMODE signal on line 26, the DIAG_SCANENABLE signal on line 401 and the DIAGSCANIN signal on line 28. This group includes the output signal DIAGSCANOUT on line 36. In diagnostic mode, the DIAG_CLOCK signal on line 38 is the reference clock signal for the timing of the all signals on the TAP controller interface and has a significant rising edge. This signal corresponds to and maybe directly connected from the incoming clock signal TCK. The DIAGMODE signal on line 26 indicates that the TAP controller is in the diagnostic mode. The signal DIAG_SCANENABLE on line 401 asserts that the data on DIAGSCANOUT is valid and is ready to be shifted out on each successive significant edge of the clock. The DIAGSCANIN signal on line 28 represents serial input data which is valid when both the DIAGMODE and the DIAG_SCANENABLE signals are asserted. The DIAGSCANIN signal may be directly connected to the incoming pin TDI 22. The DIAGSCANOUT signal represents serial output data which is valid when both the DIAGMODE and DIAG_SCANENABLE are asserted. This signal changes following the relevant rising edge of the DIAG_CLOCK. The DIAGSCANOUT signal corresponds to the outgoing signal TDO 20 and may be connected, for example, by a multiplexor and a flip-flop triggered on the falling edge of the incoming clock TCK.

Data adaptor signals at the on-chip interface include a further two groups, namely receive stream data signals and transmit stream data signals. The data adaptor 90 outputs data RX_DATA to on-chip source/destination logic on a receive data bus 94 and receives data TX_DATA from on-chip source/destination logic on a transmit data bus 92. All of the signals on interface 42 are synchronous signals clocked by the SYS_CLOCK signal on line 407. The signals on lines 100 and 102 are the control signals which regulate the flow of data on bus 94. The signals on lines 96 and 98 regulate the flow of data on bus 92. The receive stream data signals associated with the transfer of data RX_DATA on line 94 include the RX_REQUEST signal on line 100 which when asserted indicates that data is valid and a sample is requested to be transferred, the RX_GRANT signal on line 102 which is a "default grant" signal and may be asserted or withdrawn independently of RX_REQUEST. When RX_GRANT is asserted and if the RX_REQUEST signal is also asserted, the data will be committed for transfer. However, when the RX_GRANT signal is asserted but the RX_REQUEST signal is not asserted, the RX_GRANT signal indicates merely that the on-chip source/destination logic is ready to transmit data. Note that requests to transfer data to on-chip source/destination logic indicated by the RX_REQUEST signal are not accepted unless the RX_GRANT is also asserted. Moreover, the request may not be subsequently withdrawn. The RX_DATA may not change from a previously ungranted cycle. The RX_ERROR signal on line 408, when not asserted, indicates that a data byte has been received without protocol violation (initial default value) The RX_ERROR signal is deasserted only when the data is received without a protocol violation. This signal is particularly useful in environments where live-disconnect and live-connect are required. Any data received from the TAP controller 4 which violates the protocol is not transferred to RX_DATA and RX_REQUEST is not asserted. The DIAG_RESET signal on line 409 may be used to reset the diagnostic logic 300 (see FIG. 1) connected to the receive stream data interface or transmit stream data interface. When asserted the DIAG_RESET signal initiates a synchronous resetting and initialisation of other on-chip diagnostic logic. This signal is an asynchronous output and is not asserted during structural scan tests in order to facilitate the scan testing of on-chip diagnostic logic.

Protocol violations on the serial data received from the TAP controller 4 may arise, for example, because the physical connection between this chip and the off-chip logic has been broken.

Although not shown, the TAP controller interface would also handle the signals tst_scanenable, tst_scanin, tst_scanout and tst_mode to support full scan testability of the data adaptor itself.

Referring now to the transmit data stream signals at the data adaptor 90 interface with on-chip source/destination logic, bus 92 carries data TX_DATA for transmission to off-chip logic. The TX_REQUEST signal on line 96 when asserted indicates that TX_DATA is valid and a sample is requested to be transferred. The TX_GRANT signal on line 98 is a "default grant" signal and may be asserted or withdrawn independently of the TX_REQUEST signal. When asserted while the TX_REQUEST signal is asserted, the TX_GRANT signal means that the data is committed to transfer. However, a request to transfer data will not be accepted unless the TX_GRANT signal is asserted. Once asserted, the request may not be withdrawn. The data TX_DATA may not change from previous ungranted samples. When the TX_GRANT signal is asserted in the absence of the TX_REQUEST signal, it merely indicates that the adaptor clock 90 is ready for data transfer. In the event of a live-disconnect, which may be detected by a protocol violation on the received serial data, the last data byte transmitted may be corrupted or lost. Subsequent data bytes are not transmitted and the TX_GRANT signal is not asserted until data is received without a protocol violation. The RX_ERROR signal on the receive stream interface can be used to handle this condition.

Note that the system clock signal SYS_CLOCK 407 is generated on-chip and is, for the purposes of illustration, wholly independent from the DIAG_CLOCK signal on line 38 which originates off-chip.

Figure 4:
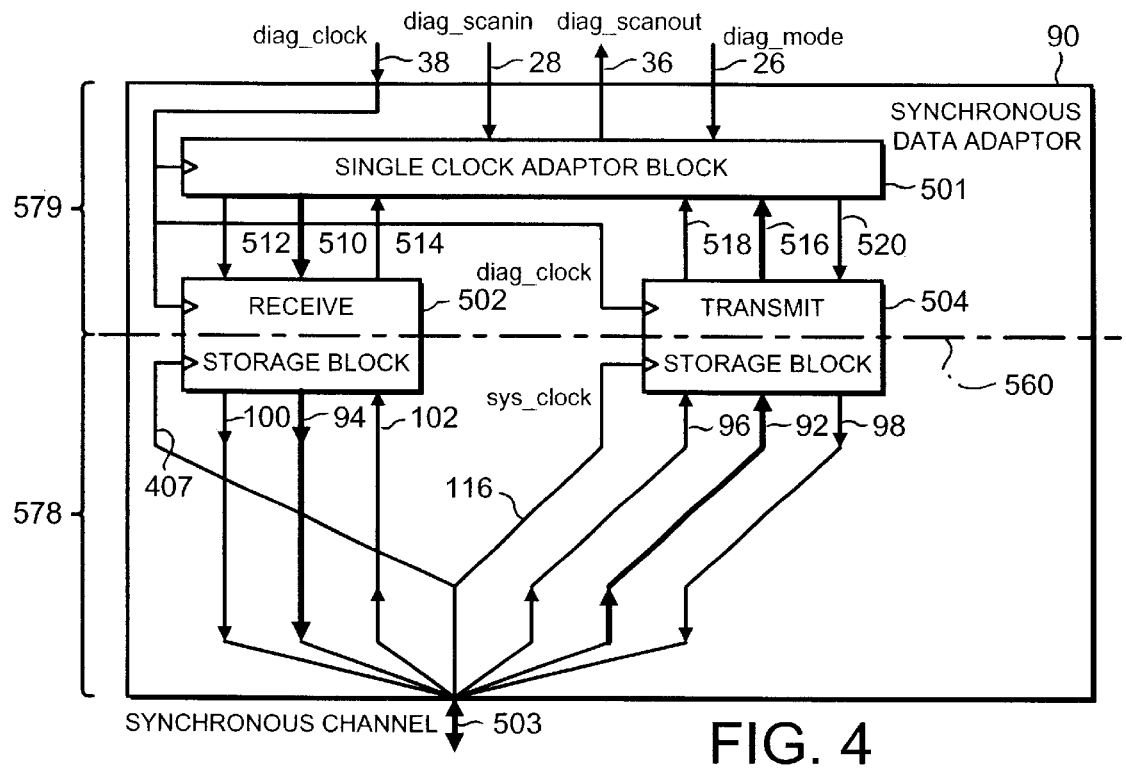
FIG. 4 is a block diagram of one embodiment of a synchronous data adaptor.

FIG. 4 illustrates a data adaptor 90 for use in a single processor core environment. The data adaptor 90 comprises a single clock adaptor block 501 and receive and transmit storage blocks 502,504. Consistent with FIG. 3, the inputs to the adaptor block 501 from off-chip include the DIAG_CLOCK signal on line 38, the DIAGSCANIN signal on line 28 and the DIAGMODE signal on line 26. The adaptor block 501 transmits the DIAGSCANOUT signal off-chip on line 36.

Figure 5:
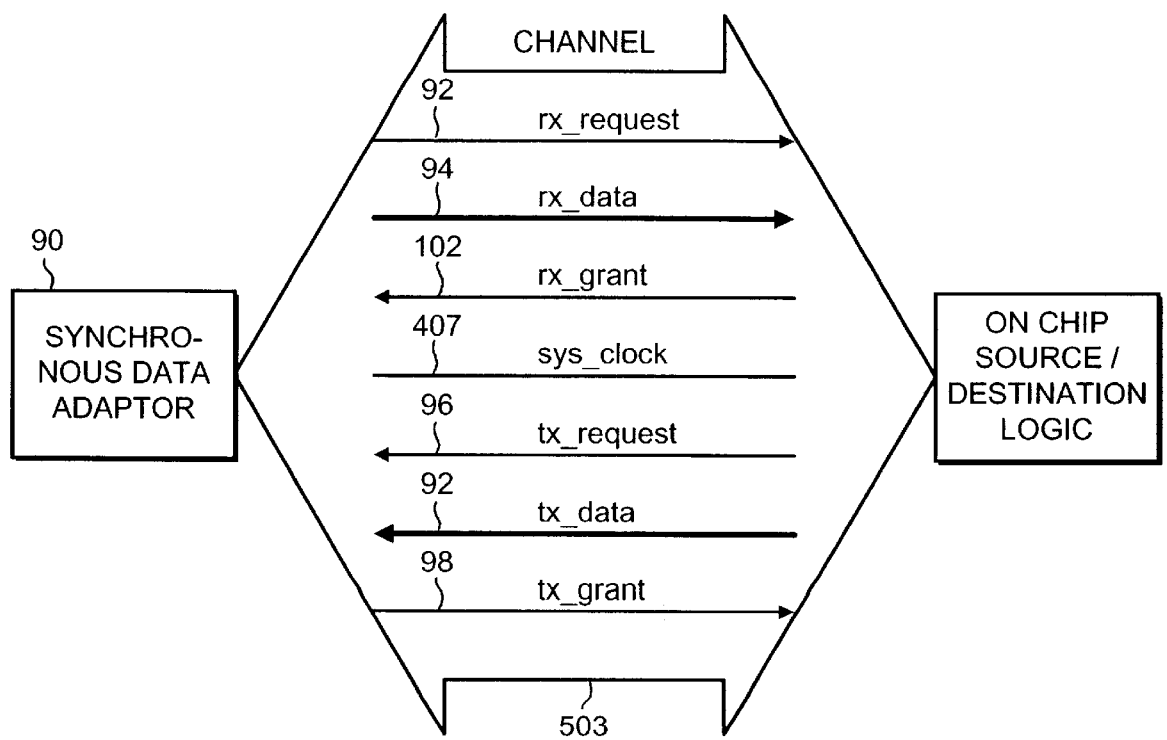
FIG. 5 illustrates signals which may be carried by a synchronous channel between the preferred data adaptor and on-chip functional circuitry.

The interface with on-chip source/destination logic is represented as a single synchronous channel which carries the receive stream data, the transmit stream data and all of the associated control signals mentioned with reference to FIG. 3. This synchronous channel is illustrated schematically in FIG. 5 and in practice will comprise a number of hard wired conductive elements.

Referring back to FIG. 4, the receive storage block 502 receives as inputs from the single clock adaptor block 501 the receive stream data RX_DATA on line 510 and a first control input signal RX_REQ1 on line 512. The receive storage block 502 outputs to the single clock adaptor block 501 a first control output signal RX_GRANT1 on line 514. The receive storage block 502 outputs via the synchronous channel the receive data RX_DATA2 on line 94 and a second control output signal RX_REQ2 on line 100. The receive storage block 502 receives as an input from the synchronous channel a second control input signal RX_GRANT2 on line 102. The transmit storage block 504 handles the transmit data stream in a similar manner. The transmit storage block 504 receives as signals from the synchronous channel a first transmit data signal TX_DATA1 on line 92 and a first control input signal TX$_{13}$REQ1 on line 96. The transmit storage block 504 outputs via the single channel a first control output TX_GRANT1 on line 98. The transmit storage block 504 outputs to the single clock adaptor block 501 a first_data output signal TX_DATA2 on line 516 and a second control output signal TX_REQ2 on line 518. The transmit storage block 504 receives as an input from the single clock adaptor block 501 a second control input signal RX_GRANT2 on line 520.

The DIAG_CLOCK signal on line 38 is supplied to the single clock adaptor block 501. The receive storage block 502 and the transmit storage block 504 receive both the SYS_CLOCK signal 116 originating on-chip and the DIAG_CLOCK signal 38. The clock boundary between the off-chip clock DIAG_CLOCK environment and the on-chip SYS_CLOCK environment therefore falls within the receive and transmit storage blocks 502,504 and is indicated by the broken line 560.

Figure 6:
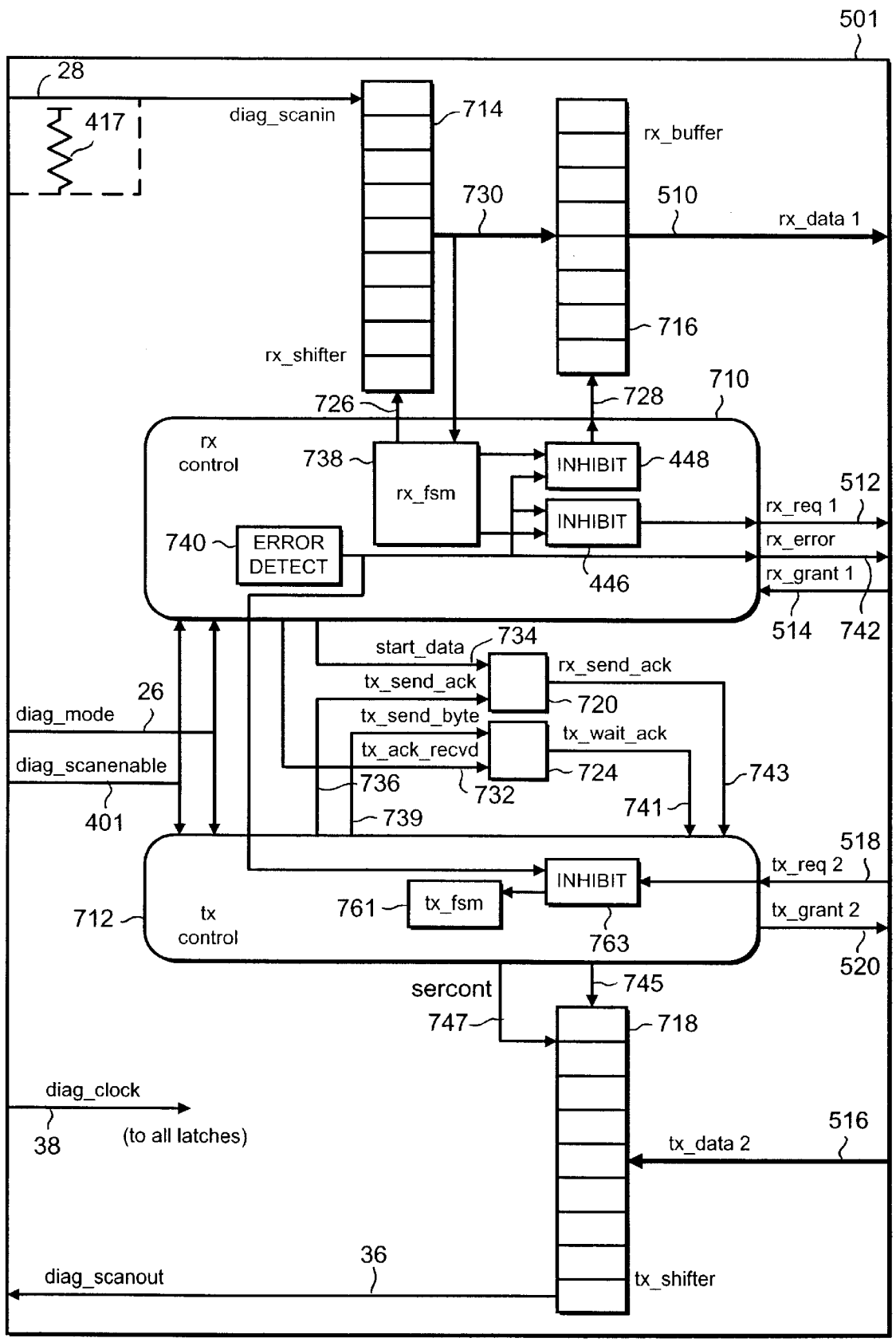
FIG. 6 schematically illustrates the internal architecture of an adaptor block of a preferred data adaptor.

FIG. 6 schematically illustrates the preferred internal architecture of the single clock adaptor block 501 of FIG. 4. The single clock adaptor block 501 comprises a receive shift register 714, a receive buffer 716, receive control logic 710 controlled by a finite state machine 738, a receive flow control status flip-flop 720, a transmit flow control status flip-flop 724, a transmit shift register 718, and transmit control logic 712. The receive shift register 714 receives the serially multiplexed signals DIAG_SCANIN on line 28 and a control signal from the receive control logic on line 726, and outputs data in parallel on bus 730 to form an input to the receive buffer 716. The receive buffer 716 additionally receives a control signal from the receive control logic 710 on line 728 and generates the receive data RX_DATA1 on bus 510. The receive control logic 710 additionally generates the signal RX_REQ1 on line 512, receives the signal RX_GRANT1 on line 514, receives the signal DIAGMODE on line 26, receives the signal DIAG_SCANENABLE on line 401 and generates signals START_DATA and RX_ACKRECD on lines 734 and 732 respectively. The receive control logic 710 further includes an error detector 740 which receives the input serial stream DIAG_SCANIN and detects when an error in communication arises. When an error condition has been detected, an error condition indicator signal is asserted on line 742 and this is asserted as an error signal RX_ERROR externally of the receive control block 710. The error indicator 742 is also supplied to a valid inhibitor 446 which inhibits generation of the RX_REQ1 signal in an error condition. The error indicator 742 is also supplied to a receive signal inhibitor 448 which under the control of the finite state machine 738 inhibits the receive buffer 716 from allowing any further incoming data RX_DATA1 to be communicated on bus 510. In order to further assist in the detection of disconnection the input signal 28 DIAG_SCANIN has a pull-up resistor 417. If the connection is broken, then the signal goes high, that is to a logical one, and the error condition is detected. When the connection is reestablished, the signal is driven low, that is to a logical zero, from the other end of the cable and a clean condition is detected. The pull-up resistor 417 can as a matter of practicality be located off-chip.

The receive flow control status flip-flop 720 receives the signal START_DATA on line 734 and a signal TX_SEND_ACK on line 736, and outputs a signal RX_SEND_ACK to the transmit control logic 712 on line 743. The transmit flow control status flip-flop 724 receives the signal RX_ACK_RECD on line 732 and a signal TX_SEND_BYTE on line 739, and outputs a signal TX_WAIT_ACK to the transmit control logic 712 on line 741. The transmit control logic 712 which is managed by a finite state machine 761 receives the signal DIAGMODE on line 26 and the signal TX_REQ2 on line 518, and outputs the signal TX_GRANT2 on line 520, a control signal to the transmit shift register 718 on line 745, and a parallel signal SERCONT to the transmit shift register 718 on line 747. The transmit control logic 712 also receives the error indicator 742 which is supplied to a transmit inhibitor 763 and which inhibits further transmission of data off-chip when an error condition is detected by inhibiting the TX_REQ2 signal on line 518. This has the effect of causing the data TX_DATA1 on bus 516 to be ignored. The transmit shift register 718 additionally receives the parallel data TX_DATA2 on bus 516, and outputs the signal DIAGSCANOUT on line 36.

Thus, the single clock adaptor block 501 converts the unidirectional serial data from off-chip through the TAP controller 4 into a format more suited for use by the on-chip source/destination logic. Conversely the data adaptor must convert the data format supplied by the on-chip source/destination logic into uni-directional serial data. In the preferred embodiment, it is desired to provide data to the on-chip source/destination logic in the form of eight parallel bits, or a byte, of data. However, in the extreme the receive data bus 516 and the transmit data bus 815 could be only one bit wide, rather than a byte, wide. It is also envisaged that the receive and transmit data buses 510 and 516 could be multiple byte wide buses.

Referring to FIG. 6, the receive control logic 710 of the data adaptor receives the serial data signal DIAG_SCANIN. When the receive control signal recognises two successive serial bits as being the start bits S1 and S2, the receive shift register 714 is controlled on the line 726 to serially load the next eight successive bits, which form a data byte, therein.

The error detector 740 operates by detecting the lack of a stop bit such as stop bit E1 in the incoming data stream. Once an error of this type has been detected, the error indicator 742 is asserted which has the effect of inhibiting further data from being transmitted or received. In addition, the external error signal RX-ERROR can be used to generate a visual indication that an error condition has been detected. When in the error condition, a reset block continues to monitor the serial input stream for a logic zero for a suitable number, e.g. ten continuous clock periods. If this clean input is detected, then the error indicator signal on line 742 is deasserted and data transmission and reception is resumed.

In response to the two consecutive start bits S1 and S2, the receive control logic 710 also sets the signal START_DATA on line 734, which sets the receive flow control status flip-flop 720. When set, the receive flow control status flip-flop 720 in turn sets the signal RX-SEND-ACK on line 743, which signal causes the transmit control logic 712 to send an acknowledgement signal on the test data output signal TDO. This acknowledgement signal comprises only a start acknowledge bit ACK and a stop bit E1. These bits are loaded directly into the transmit shift register 718 in parallel as the signal SERCONT on line 747 under the control of the signal on line 745, and output from the transmit shift register in serial fashion as the signal DIAGSCANOUT. Once the acknowledgement signal has been sent, the transmit control logic 712 sets the signal TX-SEND-ACK on line 736 to reset the receive flow control status flip-flop 720 and thereby reset the signal RXSEND-ACK.

The signal SERCONT, in accordance with the flow control protocol used in this embodiment, is a 3 bit signal which enables the start bits S1,S2 and the stop bit E1 to be loaded directly into the transmit shift register 718. When a byte of data TX_DATA presented by the on-chip destination logic, to be output through the TAP controller 4, is present on the transmit data bus 516 it is loaded in parallel under the control of the transmit control logic 712 into the transmit shift register 718, and the transmit control logic 712 directly loads the start bits S1,S2 and the stop bit E1 forming signal SERCONT into the appropriate bit positions in the transmit shift register prior to serially shifting the signal. When sending an acknowledgement signal the transmit control logic 718 directly loads a single start bit and a stop bit into the transmit shift register, and then serially shifts them out.

When the receive control logic 710 receives the stop bit E1 on the signal DIAG_SCANIN, the data byte has been loaded into the receive shift register 714, and under the control of the receive control logic 710, the data byte is transferred on bus 730 from the receive shift register 714 to the receive buffer 716. When a data byte RXDATA has been loaded into the receive buffer 716 it is output on the bus 510 under control of the receive logic 710, which also sets the signal RX-REQ1 on line 512. The receive storage block 502, responsive to the signal RX-REQ1, accepts the data byte on the bus 510 and indicates this acceptance by setting the signal RX-GRANT1 on line 514. In response to the signal RX-GRANT1 the receive control logic 710 resets the signal RX-REQ1, and if there is a further data byte in the receive shift register 714 transfers this to the receive buffer 716 before again setting the signal RX-REQ1.

The receive buffer 716 is provided in the preferred embodiment. This allows acknowledge tokens, which overlap the reception of data, to be transmitted as soon as the two start bits have been received, and this also supports efficient data transfer rates by allowing successive bytes to be transferred without any gap between each byte. Data buffering may also be provided on the transmit side.

The source/destination logic on-chip transfers data bytes in parallel to the data adaptor 90 on the TXDATA bus 92. When the destination/source logic on-chip has a byte of data to be transmitted, the signal TX-REQ1 on line 96 is set. In response to the signal TX_REQ1 being set, the transmit storage block 504 receives and forwards the data in a manner described hereinafter. The transmit storage block 504 transfers data bytes TX-DATA in parallel to the adaptor block 501 on the bus 516. When the transmit storage block has a byte of data to be transmitted, the signal TX-REQ2 is set on line 518. In response to the TX-REQ2 signal being set, the transmit control logic 712 of the adaptor block 501 controls the transmit shift register 718 via line 745 to load the data byte TXDATA on the bus 516 in parallel. In addition, using lines 747 the transmit control logic loads the appropriate start bits S1 and S2 and the stop bit E1 into the transmit shift register 718. Then, again under the control of the signal 745, the data byte including two start bits and a stop bit is serially shifted out of the transmit shift register as signal DIAG-SCANOUT on line 36, which is connected through the TAP controller to the signal TDO. When the data byte TX_DATA on the bus 516 is loaded into the shift register 78, the transmit control logic 712 sets the signal TX-GRANT2 on line 520 to acknowledge receipt of the data byte to the transmit storage block 504. The transmit storage block 504 can then transmit a further byte of data originating from on-chip source/destination logic. Data buffer means corresponding to receive buffer 716 may be provided in association with the transmit shift register 718 if desired.

When the transmit shift register 718 is controlled by the transmit control logic 712 to output serial data, the transmit control logic 712 also sets the signal TX-SEND-BYTE on line 739, which sets the transmit flow control status flip-flop 724. In response to this signal, the transmit flow control status flip-flop 724 sets the signal TX-WAIT-ACK on line 741. Whilst the TX-WAIT-ACK signal is set, the transmit control logic 712 is waiting for an acknowledgement from the destination/source logic off-chip that the data byte set has been received. If the source/destination logic off-chip successfully receives the transmitted data byte then it sends an acknowledgement signal on the test data input signal TDI of the TAP controller 4. Upon receipt of such an acknowledgement signal as the DIAG_SCANIN signal on line 28, the receive control logic 710 will set the signal RX-ACK-RECD on line 732, causing the transmit flow control status flip-flop 724, and consequently the signal TX-WAIT-ACK, to be reset. The transmit control logic 712 is then prepared to receive and transmit the next parallel data byte from the transmit storage block 504.

Although not shown in FIG. 6, all of the components of adaptor block 501 requiring a clock signal are served by the off-chip clock signal DIAG_CLOCK on line 38.

Figure 7:
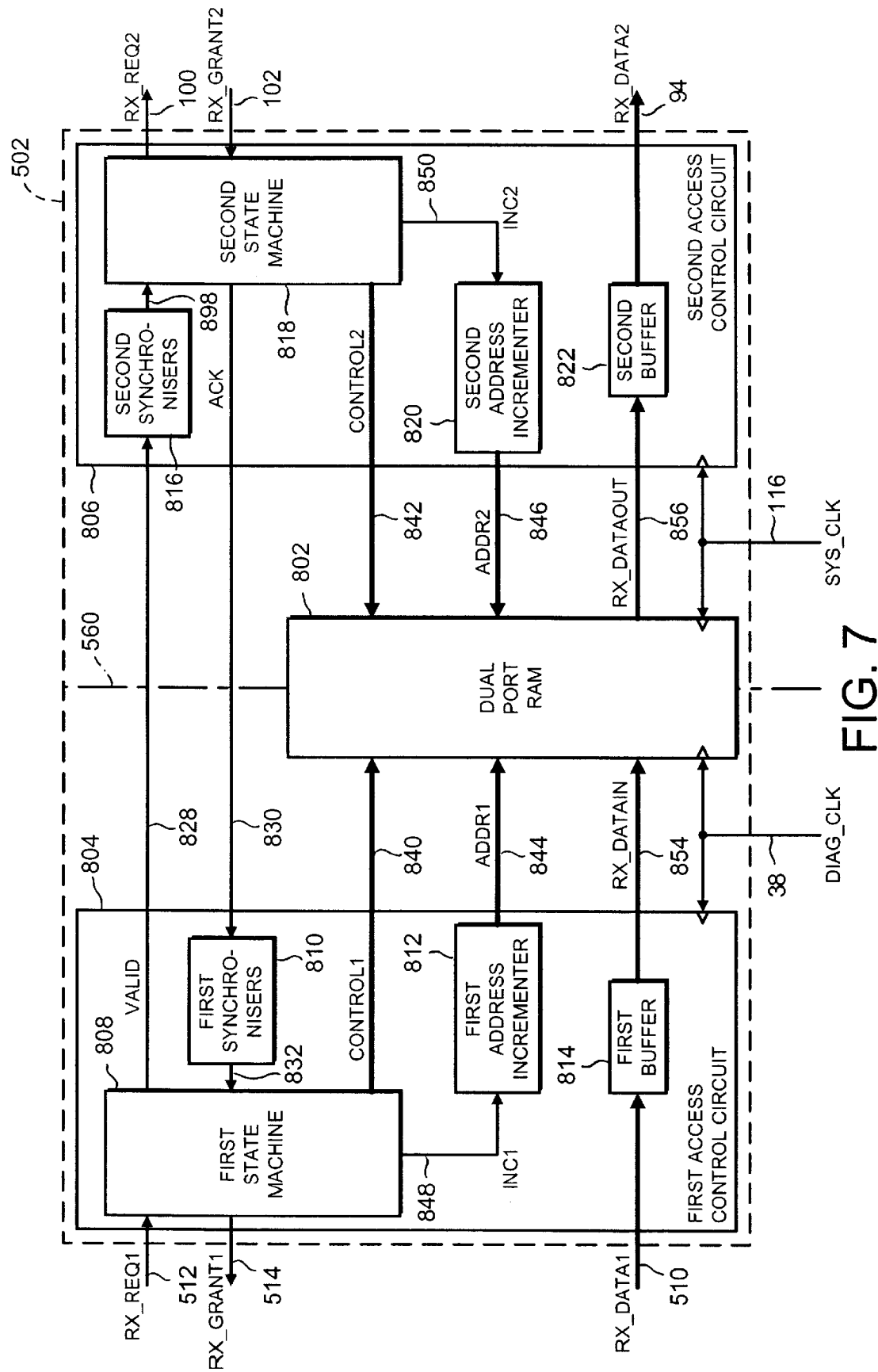
FIG. 7 schematically illustrates the internal architecture of a preferred receive/transmit storage block.

FIG. 7 schematically illustrates the internal architecture of preferred storage blocks 502,504 for the receive and transmit streams. The receive storage block 502 and transmit storage block 504 provide means for passing control (and data) information between clock environments. Preferably both are dual port buffers such as that illustrated in FIG. 7. For clarity, this block will be explained as if it were the receive storage block 502. It will be apparent how a corresponding dual port ram operates at the transmit stream interface.

Referring now to FIG. 7, the preferred receive storage block 502 includes a dual port RAM 802, a first access control circuit 804 and a second access control circuit 806. The first access control circuit 804 comprises a first state machine 808, first synchronisers 810, a first address incrementer 812 and a first buffer 814. The second access control circuit 806 comprises second syncrhonisers 816, a second state machine 818, a second address incrementer 820 and a second buffer 822.

The first access control circuit 804, which operates in the off-chip timing environment under the control of the clock signal DIAG-CLK, receives from adaptor block 501 on bus 510 data RX-DATA1 to be transferred to an on-chip timing environment, in this case operating under the control of the SYS_CLK signal. The data RX-DATA1 may pass through the optional first buffer 814 for the purpose of boosting the electrical drive of the signals or for re-timing under the control of the clock signal DIAG-CLK. The first buffer 814 outputs the data as the signals RX__DATAIN on bus 854.

The first buffer 814 and second buffer 822 are optional. These buffers may be present for two reasons:
1. To electrically buffer the signals to present a low load to the source, or to provide sufficient drive into the destination.
2. To provide a timing adjustment (i.e. to re-time the signal) with respect to the DIAG__CLK signal, where for example the data arrives late in the cycle from the source, but is required early in the cycle by the destination.

The first access control circuit 804 also receives from adaptor block 501 the control signal RX-REQ1 on line 512 which the adaptor block 501 outputs to indicate that there is valid data to be transferred to the SYS-CLK timing environment. The signal RX-REQ1 forms an input to the first state machine 808. In response to the signal RX-REQ1, the first state machine 808 controls the transfer of the data RX-DATA1 into the dual port RAM 802. The first state machine 808 outputs a signal INC1 on line 848 to the first address incrementer 812, and the first address incrementer increments the address value ADDR1 on bus 844 to the dual port RAM 802. In preferred embodiments data to be transferred is stored in successive memory locations of the dual port RAM 802, such that for each block of data which is stored in the dual port RAM 802 the first address incrementer 812 increments the storage address by one block. Thus, initially, the address to which the first address incrementer directs the data to be stored is an initial or base address. The first state machine 808 also outputs on bus 840 control signals CONTROL1 to control the loading of the data into the selected address. Thus, under the control of the clock signal DIAG-CLK, the data RX__DATAIN on bus 854 of the output of the first buffer is loaded into the dual port RAM at the selected address.

Once the data to be transferred has been successfully loaded into the dual port RAM, the first state machine 808 outputs a signal RX-GRANT1 on line 514 back to the adaptor block 501, thereby indicating to the adaptor block 501 that it may begin to send a further block of data on the bus 510. Furthermore, when sufficient data has been loaded into the dual port RAM 802, the first state machine 808 sends a signal VALID on line 828 across the clock boundary to the second access control circuit 806.

The signal VALID on line 828 is received by the second synchronisers 816 of the second access control circuit 806, and the synchronised output of the second synchronisers 816, being the signal VALID synchronised to the second clock signal SYS-CLOCK, forms an input 898 to the second state machine 818. In response to the synchronised signal VALID the second state machine 818 outputs control signals on the second control bus CONTROL2 842 to the dual port RAM 802, and outputs a signal INC2 on line 850 to the second address incrementer 820. This process is repeated according to how much data was transferred. Thus, the second state machine 818 controls the access of a data block stored in the dual port RAM at a location identified by the address ADDR2 on the address bus 846 output from the second address incrementer. As with the first address incrementer 812, in this preferred embodiment the second address incrementer, in its initial state, retrieves data blocks from a base address, and thereafter from successive address locations. Thus, the second address incrementer follows the first address incrementer such that data is first retrieved from the block to which data has first been written, and so on through successive memory access cycles. Thus the data block which has been stored in the dual port RAM by the first access control circuit 804 is output as RX__DATAOUT on the data bus 856 and stored in the second buffer 822 under the control of the clock signal SYS-CLK on line 116.

Once the data block has been successfully retrieved from the dual port RAM 802, the second state machine 818 sets a signal ACK on line 830 which is transferred to the first timing environment and the first access control circuit 804. The signal ACK is received by the first synchronisers 810, and the synchronised output thereof is input on line 832 to the first state machine 808. When the first state machine 808 receives the synchronised signal ACK on line 832 it indicates that there is further space in the dual port RAM 802 for the first access control circuit to load data into.

When the data block RX__DATA2 has been successfully accessed from the dual port RAM 802, the second state machine 818 also outputs a signal RX-REQ2 on line 100 to the source/destination logic on-chip in the second timing environment to which the data is to be transferred. This signal indicates that valid data is available on the data bus 94 on the output of the second buffer 822. When the destination circuit receives the signal RX-REQ2 it loads therein the data DATA2 on the bus 94 and once this is done returns a signal RX-GRANT2 on line 102 to the second state machine 818, in response to which the second state machine 818 can, if further data blocks are available in the dual port RAM 802, access these data blocks and forward them to the destination circuit.

In the receive storage block 502 of FIG. 7, it is shown that the control protocol between the two timing environments is a single signal VALID in one direction from the first timing environment to the second timing environment, and a single signal ACK in the other direction from the second timing environment to the first timing environment. However, the particular protocol that is used to control the flow of data across the timing boundary may vary considerably according to, for example, the volume of flow of data, and the relative speeds of the two clocks of the respective timing environments. For instance, if the clock signal SYS-CLK in the second timing environment was much faster than the clock signal DIAG-CLK in the first timing environment, then it is possible that the return signal of the protocol described with reference to FIG. 7, i.e. the signal ACK on line 830 could be dispensed with. However, to successfully operate such a system where there would be a single flow control signal in one direction, only, i.e. the signal VALID on line 828, it would be necessary to know that the dual port RAM was going to be used in an environment where the two clocks had significantly different speeds.

It can also be appreciated that the flow control signals according to the protocol of FIG. 7, rather than being the signals VALID and ACK in each direction, could in fact comprise a plurality of signals, the flow control protocol being more complex. If the flow control signals in either direction comprised a plurality of signals, then each of such signals would have synchronisers such as the synchronisers 810 and 816 associated therewith. Each of the plurality of control signals may have one or more synchronisers, in series, associated therewith.

Depending on the protocol used, even if the control signals in both directions comprise a plurality of control signals, the number of signals in each direction may differ, for example if a different protocol is being used in each direction, or be the same. Furthermore, either or both edges of any one of the control signals used may be active edges.

In particular, in one envisaged embodiment the dual port RAM 802 could be split into two halves, and each of the signals VALID and ACK could comprise two signals, one associated with the top half of the dual port RAM 802 and the other associated with the bottom half of the dual port RAM 802.

The dual port RAM of the receive storage block 502 described hereinabove transfers data or information in one direction only from the DIAG_CLK environment to the SYS_CLOCK environment. In order to allow efficient transfer of data in the other direction, i.e. from the SYS_CLK environment to the DIAG_CLK environment, preferred embodiments provide a transmit storage block 504 comprising an identical dual port RAM.

Referring back to FIG. 4, the preferred embodiment uses the dual port RAM of FIG. 7, in two instances, as an interface for: (i) receiving data from an off-chip data source having a clock determined by off-chip requirements; and (ii) transmitting off-chip data from on-chip functional circuitry operating in a clock environment determined by various on-chip requirements. The on-chip clock environment operating under the control of the SYS_CLK signal is generally designated as 578, and the off-chip clock environment operating under the control of the DIAG-CLK signal as 579. The timing environment boundary indicated by the broken line 560 is represented in both FIGS. 4 and 7 as directing the receive/transmit storage blocks 502,564.

In operation, adaptor block 501 operating under the control of DIAG-CLOCK receives serially multiplexed RXDATA on line 28 and forwards it on line 510 to the receive storage block 502, in this example a dual port RAM. The data output by the adaptor block 501 on bus 510 as RX-DATA1 is output simultaneously with the signal RX-REQ1 on line 512 which, as discussed hereinabove with reference to FIG. 7, is a protocol control signal. The receive dual port RAM 502 then transfers the data RX-DATA1 on bus 510 from the clock environment of the DIAG-CLK signal to the environment of the SYS-CLK signal on the data bus 94. In the SYS-CLK environment the data on bus 94 is indicated as RXDATA2, although it will correspond to the data RX-DATA1 in the DIAG-CLK environment. Thus the receive storage block 502 is clocked by the DIAG-CLK signal on line 38 and also a SYS-CLK signal on line 116. The data RXDATA2 on the bus 94 is received in the system environment 578 and synchronised to the system clock SYS-CLK.

Similarly, in the reverse direction, on-chip source/destination logic outputs data TXDATA1 on bus 92 under the control of the system clock SYS_CLK for transmission into the DIAG-CLK environment on bus 516. This transmit data and the associated control signal on line 518 is received by the transmit storage block. The data on bus 516 corresponds directly to the data on bus 92 but is synchronised to a transmit clock signal DIAG-CLK on line 38 which originates the off-chip. In a preferred embodiment, the transmit storage block 504 operates in identical fashion to the receive storage block 502 described with reference to FIG. 7. The data on bus 512 is transmitted by the adaptor block 501 onto the TAP controller as serial data.

Thus, the receive and transmit stream interfaces of the data adaptor 90 are synchronous interfaces served by one or more channels connecting to on-chip source/destination logic. The theoretical maximum data transfer rate (bandwidth) on each of the receive and transmit stream interfaces is increased from about one data transfer per eight clock cycles with a typical asynchronous interface to about one data transfer per clock cycle.

The requirement for synchronisers and other asynchronous interface considerations in the on-chip source/destination circuitry is eliminated.

Figure 8:
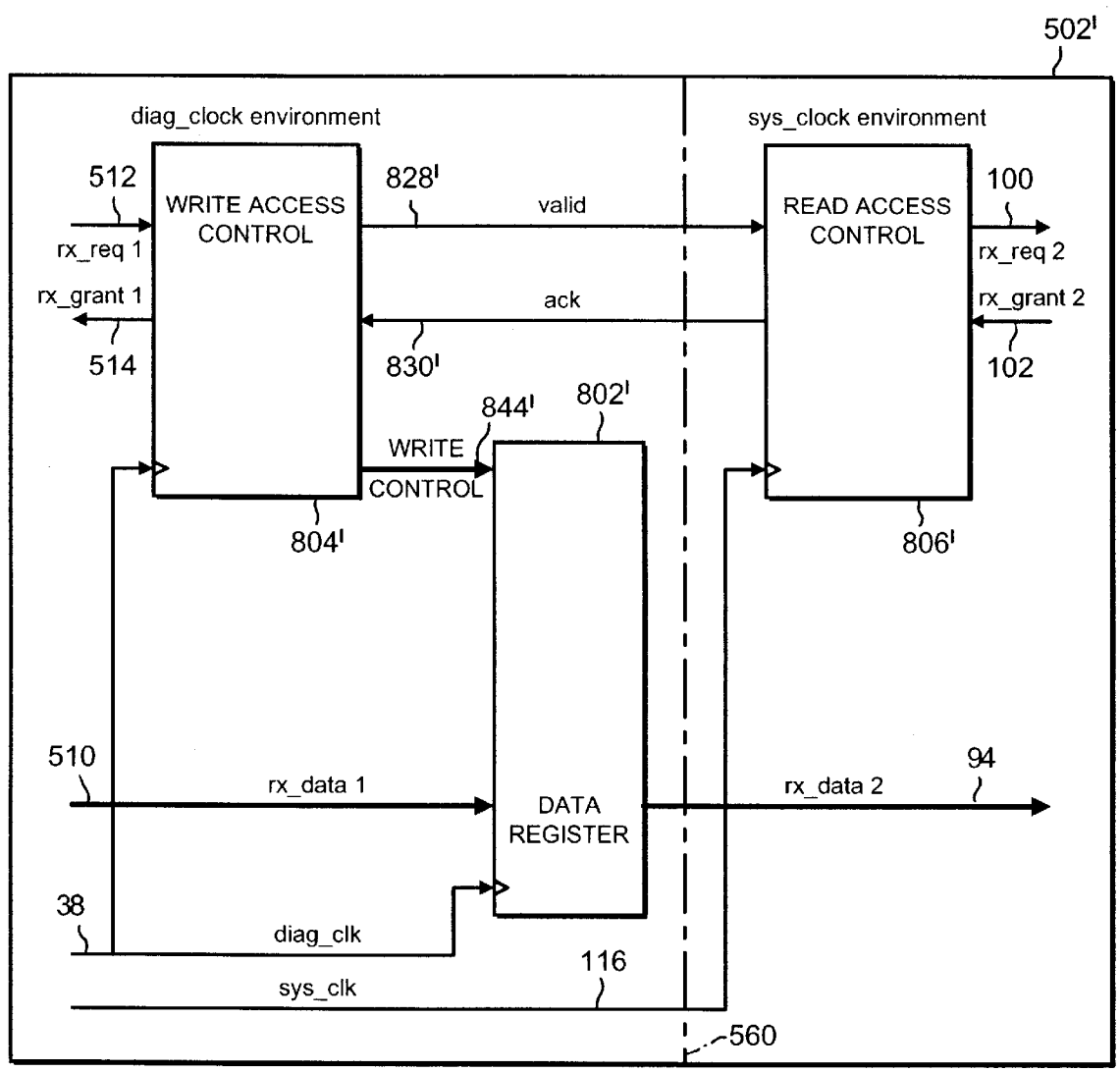
FIGS. 8 and 9 schematically illustrate simplified receive/transmit blocks.
Figure 9:
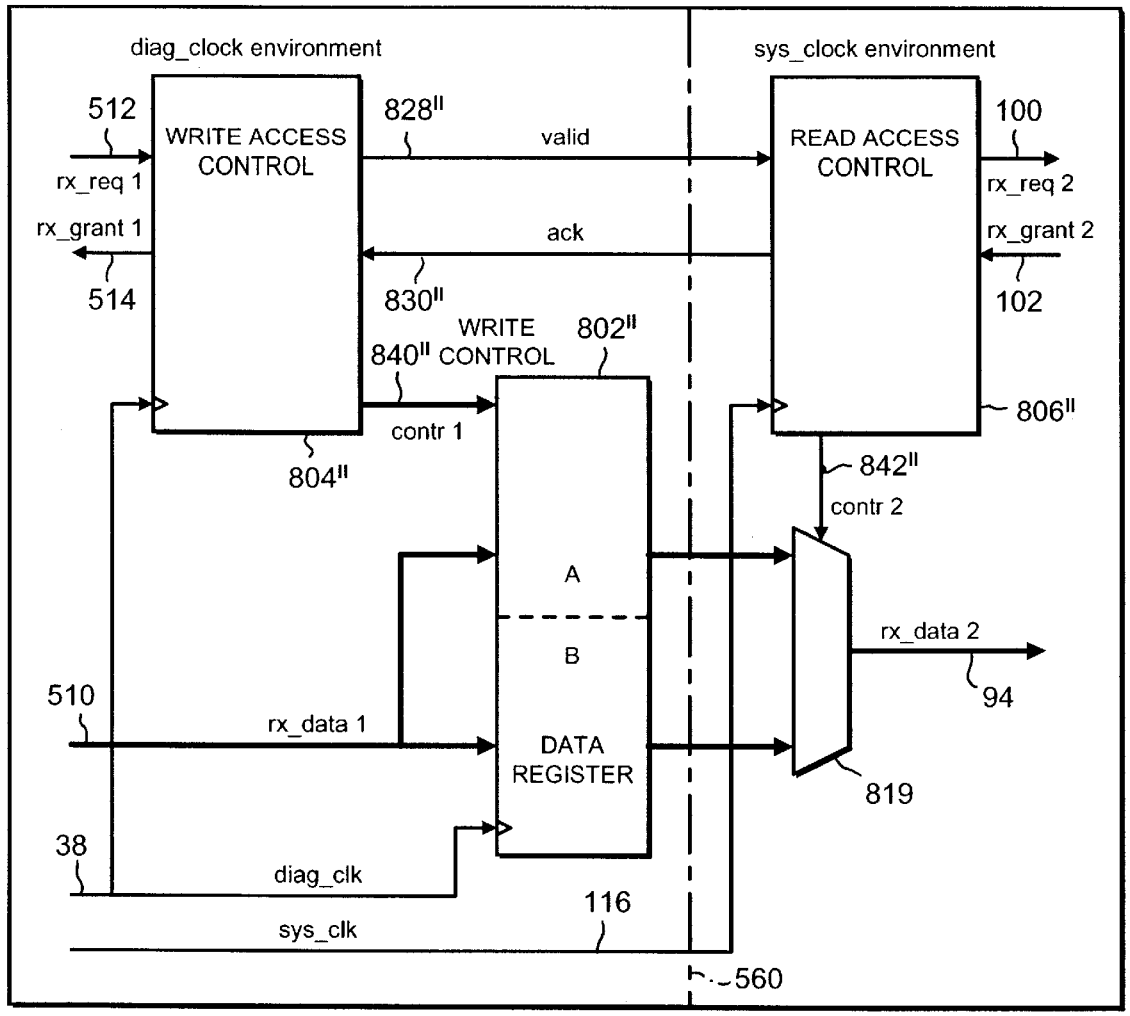

The data input buses 510,854 and the data output buses 856,94 of the dual port RAM of FIG. 7 and of corresponding blocks illustrated in FIGS. 8 and 9 respectively are preferably all 8 bit wide buses. However, the respective bus widths on the or each receive/transmit storage block 502,504 may vary depending on the application or the configuration of a particular implementation.

In other modified embodiments of the data adaptor 90, one or more of the receive 502 and transmit storage blocks 504 comprises a storage element other than a dual port RAM 805. These alternative storage elements may or may not have buffering capability as will be explained below.

In one modified version, the transmit storage block 504 is a simple storage element rather than a dual port RAM 805. For a given application, it may be that the higher bandwidth/data rate is only required in one direction. In this case, where the high bandwidth is not required, a simplified storage block can be used as one of the receive/transmit storage blocks 502,504 in place of the relevant dual port RAM 802.

In another modified version, the receive storage block 502, rather than the transmit storage block 504, is a simplified storage element as opposed to a dual port RAM 805.

There may be yet another application where the high bandwidth capability afforded by the normal dual port RAM 802 is not required in either direction. In this case there is no real requirement for a synchronous data adaptor, however, in order to provide an easily interchangeable block at the design stage, a simplified synchronous data adaptor can be used where both the receive and transmit storage blocks are simplified storage elements. Thus, in this modified version, each of the receive 502 and transmit 504 storage blocks are simplified storage elements.

FIG. 8 illustrates a simplified alternative storage block 502' which comprises a single address storage element in place of the dual port RAM 805 of FIG. 7. Other aspects of the internal architecture of the storage block 502' shown in FIG. 8 correspond to those of 502 shown in FIG. 7. The simplified storage block 502' comprises a single address storage element 802', a first access control circuit 804' and a second access control circuit 806'. However, since with the storage block 502' the data register 802' comprises only a single address, there is no need for an address incrementer block. It will be apparent that the first access control circuit 804' operates in the off-chip timing environment under the control of the clock signal DIAG_CLOCK and receives from adaptor block 501 on bus 510 data RX_DATA1 to be transferred to the system clock timing environment operating under the control of the second clock signal SYS_CLOCK.

As will become apparent, the data RX_DATA1 is first passed to the data register 802' under the control of the write access circuitry 804'. The write access control circuit 804' receives from the adaptor block 501 the control signal RX_REQ1 on line 512. The RX_REQ1 signal is output from the adaptor block 501 to indicate that there is valid data to be transferred from the DIAG_CLOCK environment to the SYS_CLOCK environment. The internal architecture of the write access control circuit 804' corresponds to that of the write access control circuit 804 of FIG. 7. As with the storage block illustrated in FIG. 7, an optional buffer (not shown in FIG. 8) can be provided for the incoming data RX_DATA1.

When the RX_GRANT1 signal is asserted on line 514 indicating that the write access control circuit is ready to receive data from the adaptor block 501, data to be transferred RX_DATA1 is supplied to the data register 802' when permitted by the write control signal 844' generated by the write access control circuit 804'. Thus, the data RX__DATA1 occupies the data register 802' until it is transferred from the DIAG__CLOCK environment to the SYS__CLOCK environment under the control of the read access control circuit 806'. Once the data to be transferred has been successfully loaded into the data register 802', the write access control circuit 804' sends a valid signal on line 828' across the clock boundary to the read access control circuit 806'. The valid signal on line 828 is received by the read access control circuit 806' which permits access to the data in the data register 802'. The data which has been stored in the data register 802' is output as RX__DATA2 on the data bus 94 and may be stored in an optional second buffer (not shown) within the read access control circuit 806'. As before, the data RX__DATA2 output on bus 94 corresponds to the data RX__DATA1 which is input on bus 510, only the data RX__DATA2 is synchronised with the SYS__CLK timing environment as opposed to the DIAG__CLK environment. Once the data register 802' is free to receive fresh data, the read access control circuit 806' sends the ACK signal on line 830' which is forwarded by the write access control circuit in the form of the RX__GRANT1 signal on line 514. The RX__GRANT signal on line 514 is output to the adaptor block 501 to indicate that the data register 802' is ready to receive new data from the adaptor block.

Note that in its simplest form data register 802' is a single address register and therefore provides no buffering facility for incoming/outgoing data. That is, once the data RX__DATA1 has been stored in the data register 802' under the control of the write access control circuit 804', no further data can be stored by the data register before that data is output as RX__DATA2 under the control of the read access control circuit 806'. Although simple storage blocks such as that illustrated in FIG. 8 offer less in the way of data rate/bandwidth advantages when compared with a dual port RAM, they enable the data adaptor 90 and neighbouring circuit units to be constructed with compatible modularity, i.e. they permit greater design freedom.

FIG. 9 illustrates another storage block 502" suitable for use as one or more of the receive 502 and transmit storage blocks of FIG. 4. It will be apparent that the storage block illustrated in FIG. 9 comprises features from the storage blocks of FIGS. 7 and 8. In particular, this storage block 502" comprises a write access control circuit 804", a read access control circuit 806" and a storage element 802". The write access control circuit 804" and the read access control circuit 806" correspond to those described with respect to FIG. 7 and 8, however the storage element 802" is in fact a data register with two address locations A and B. The write access control circuit 804" operates in the off-chip timing environment under the control of the DIAG__CLK signal, whereas the read access control circuit 806" operates in the on-chip timing environment under the control of the SYS__CLK signal. The data RX__DATA1 supplied from adaptor block 501 on bus 510 may pass through an optional first buffer (not shown) in the write access control circuit. The first access control circuit 804" receives from the adaptor block 501 the control signal RX__REQ1 on line 512 which the adaptor block 501 outputs to indicate that there is valid data to be transferred to the SYS__CLK timing environment. In response to receipt of the signal RX__REQ1, the write access control circuit 804" controls the transfer of data RX__DATA1 into one of the address locations A or B of the data register 802". The write access control circuit 804" outputs a signal CONTR1 on line 840" to switch between the first address location A and the second address location B to store data as appropriate. In this embodiment, the data to be transferred is stored successively in locations A and B of the data register 802". Thus, under the control of the DIAG__CLK signal the data RX__DATA1 on bus 510 is loaded into a first address location of the data register 802".

Once the data to be transferred has been successfully loaded into the first address location, say A, the write access control circuit 804" outputs a signal RX__GRANT1 on line 514 back to the adaptor block 501, thereby indicating that it is ready to receive a further block of data on the data bus 510. Furthermore, when sufficient data has been loaded into the data register 802", which may mean that either or both of the addresses are loaded, the write access control circuit 804" sends a signal valid on line 828" across the clock boundary to the read access control circuit 806".

The signal valid on line 828" is received by the read access control circuit 806" and in response thereto the read access control circuit 806" outputs a multiplexor select control signal CONTROL2 on the control line 842" to a multiplexor 819 controlling which address is to be read from. Thus, the read access control circuit 806" controls access of a data block stored in the register 802" at a location controlled by the multiplexor select signal CONTR2 on line 842". In this way, the data block which has been stored in the data register 802" by the first access control circuit 804" is output as RX__DATA2 on the data bus 94 and optionally stored in a second buffer (not shown) under the control of the clock signal SYS__CLOCK on line 116. The data RX__DATA2 corresponds directly to the data RX__DATA1, only RX__DATA2 is synchronised with the SYS__CLK environment as opposed to the DIAG__CLK environment.

Once the data block has been successfully retrieved from the data register 802", the read access control circuit 806" sets a signal ACK on line 830" which is transferred to the DIAG__CLK timing environment and the write access control circuit 804". The signal ACK is received by the first write access control circuit 804" and indicates thereto that there is further space in the data register 802" for the first access control circuit to load data into.

Note that data register 802" has limited buffering capability and therefore provides data rate/bandwidth advantages in the transfer of data between the adaptor block 90 and on-chip source/destination logic as well as advantages in respect of design freedom.

In modified versions of the data adaptor 90, there may be provided one or more data registers corresponding to 802" with a plurality of addresses. The number of addresses and the precise operation of the receive/transmit storage block will determine the degree of data rate/bandwidth advantage afforded. In addition, the choice of receive/transmit block architecture may be different for the receive and transmit directions in different applications.

Figure 10:
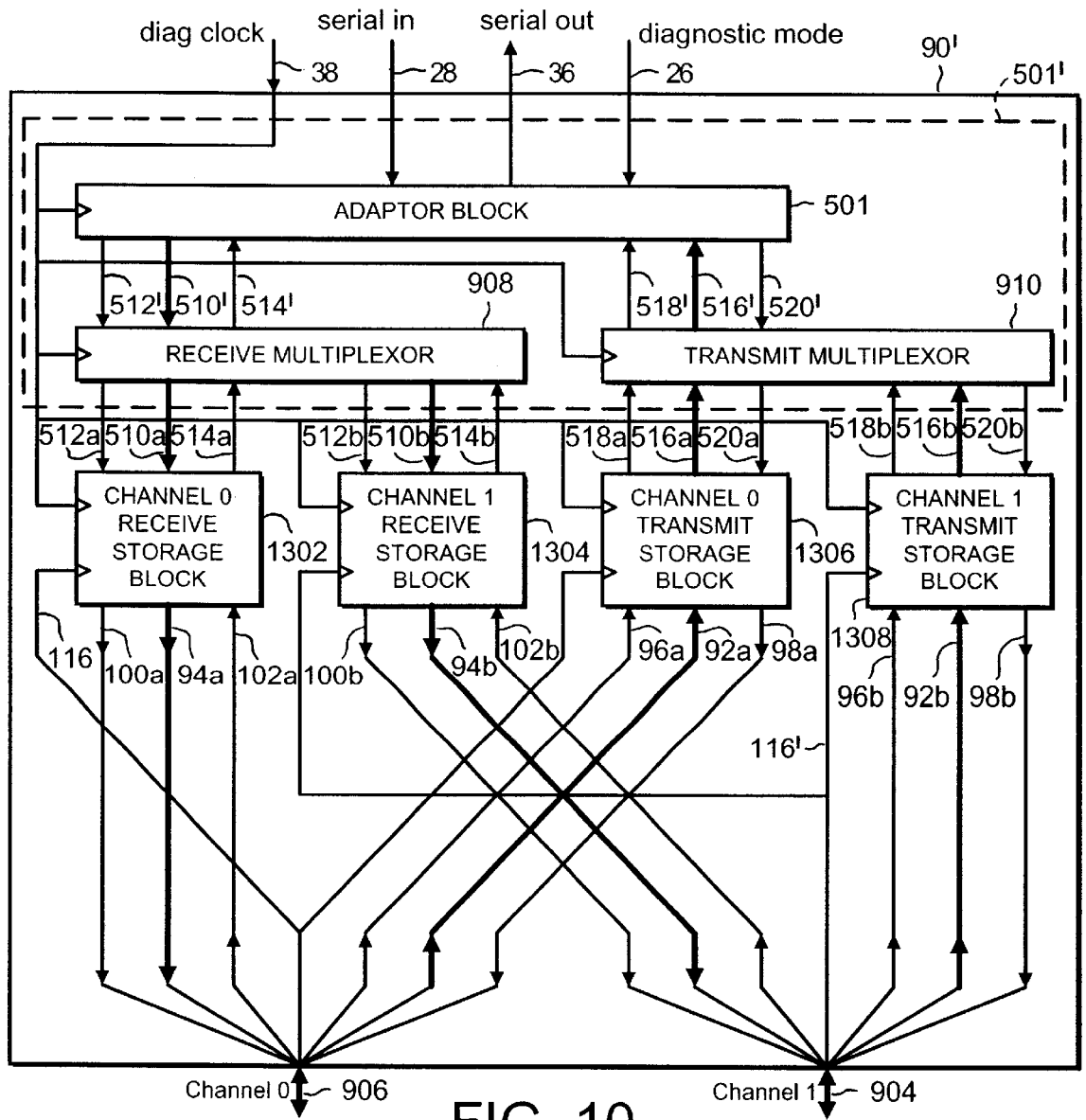
FIGS. 10 and 11 schematically illustrate an embodiment of a multi-core data adaptor.
Figure 11:
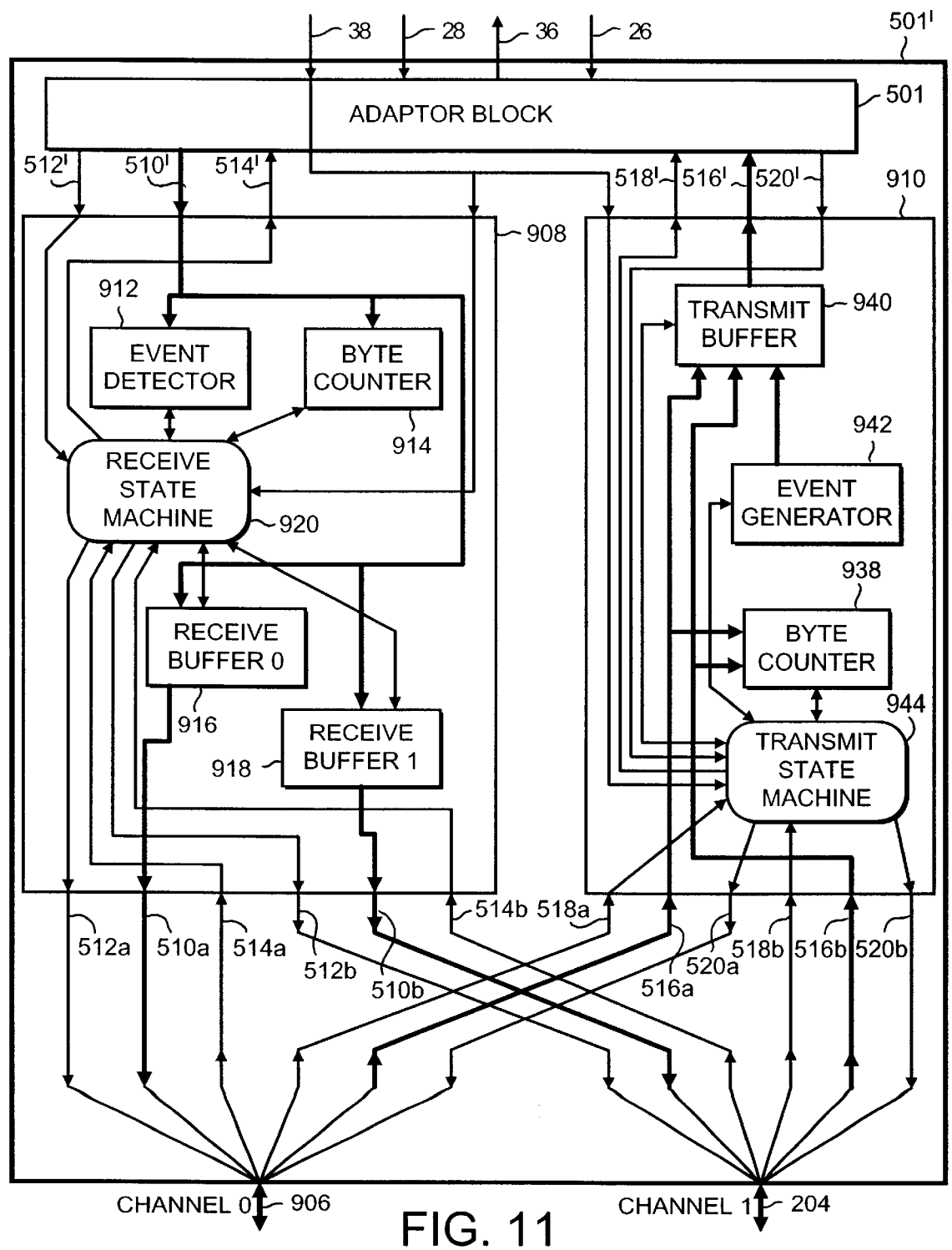

Certain embodiments provide integrated circuits with multiple processing cores and which include a test access port controller 4 for effecting communication of serial data across the chip boundary. A multi-core data adaptor, in this case for two channels, is illustrated in FIGS. 10 and 11. For this type of multi-core application, the adaptor block 501' is provided with additional circuitry to render it suitable for performing independent communication between an off-chip host and more than one on-chip processing cores. Communication between the multi-core adaptor 90' and on-chip functional circuitry is implemented by a plurality of synchronous channels, of which channels 0 and 1 are indicated by reference numerals 906 and 904. Each channel has the format illustrated in FIG. 5. For synchronous multi-core applications, each channel is likely to have its own system clock. This means that two storage blocks are required per channel.

With reference to FIGS. 10 and 11 the adaptor block 501' of the synchronous multi-core data adaptor 90' is provided with additional circuitry which includes a receive demultiplexor 908 and a transmit multiplexor 910. The receive demultiplexor 908 passes the received data stream RXDATA on bus 510' to the appropriate channel together with its corresponding incoming control signal on line 512'. The transmit multiplexor 910 receives transmit data TXDATA from the first and second channels 906,904 via respective transmit data paths 516a,516b.

Referring particularly to FIG. 10, the synchronous multi-core data adaptor 90' is supplied from the TAP controller interface with inputs including the DIAG_CLK signal on line 38, the serial input on line 28, and the diagnostic mode indication on line 26, and as an output it provides to the TAP controller serial output on line 36. The synchronous multi-core data adaptor 90' communicates serial data to and from the TAP controller 4 on lines 28 and 36. The synchronous multi-core data adaptor 90' communicates parallel data and control signals in a synchronous manner to and from a plurality of on-chip source/destination processor cores supplied respectively by separate channels indicated as 906 and 904, etc. Within the synchronous multi-core data adaptor 90' there is provided a modified adaptor block arrangement 501' which comprises an adaptor block 501 together with a receive demultiplexor 908 and a transmit demultiplexor 910 as described with reference to FIG. 11. In addition, synchronous multi-core data adaptor 90' includes receive 1302,1304 and transmit 1306,1308 storage blocks for each respective channel. The DIAG_CLK signal on line 38 which originates off-chip is supplied to the adaptor block 501, the receive demultiplexor 908, the transmit multiplexor 910, and each of the respective receive and transmit storage blocks 1302, 1304, 1306 and 1308. This arrangement is necessary because different on-chip source/destination logic elements may operate in different timing environments. That is different on-chip source/destination logic elements may operate under the control of different clock signals. In this case, this situation is indicated by the clock signal SYS_CLK1 arising from channel zero on line 116 being different to the clock signal SYS_CLK2 arising from channel one on line 116'. In addition to the DIAG_CLK signal on line 38, each of the respective receive 1302,1304 and transmit 1306,1308 storage blocks is also supplied with a relevant on-chip clock signal SYS_CLK1, SYS_CLK2. The receive storage block 1302 and the transmit storage block 1306 each being associated with channel zero are supplied with clock signal SYS_CLK1 on line 116. The receive storage block 1304 and the transmit storage block 1308 each being associated with channel one are supplied with a different clock signal SYS_CLK2 on line 116'. Although not shown, the on-chip/off-chip clock boundary can be envisaged as occurring on a substantially horizontal line through the centres of the respective receive and transmit storage blocks 1302,1304, 1306 and 1308. Thus, the interface between the synchronous multi-core adaptor block 90' and on-chip source/destination logic is represented by a plurality, in this case two, synchronous communication channels 0 and 1 (indicated by 906, 904). The receive signal groups 100a,94a,102a and 100b, 94b,102b correspond, for the separate channels 0 and 1 to the signals 100,94,102 as illustrated in FIG. 4. Similarly, the transmit group signals 96a,92a,98a and 96b,92b,98b correspond, for the respective channels 0 and 1, to the signals 96,92 and 98 of FIG. 4.

Referring particularly to FIG. 11, the receive demultiplexor comprises an event detector 912, byte counter 914, and first and second receive buffers 916,918 connected to receive the data stream RX_DATA 510' from the adaptor block 501. A receive state machine 920 receives the incoming control signal 512' and the DIAG_CLK signal 38. It generates the outgoing control signal 514' associated with the data stream RX_DATA 510' to the adaptor block 501. In addition, the receive state machine 920 receives information from, and controls, the event detector 912, byte counter 914 and the first and second receive buffers 916,918. It also receives along lines 514a,514b, the incoming control signals from the communication channels 904 and 906. In addition, the receive state machine 920 generates a RX_REQ signal on lines 512a and 512b for communication via the first and second channels 904,906, respectively.

The first buffer 916 is connected to a receive data path 510a for communicating receive data via the first channel 906 (see FIG. 10). The second buffer 918 is connected to a receive data path 510b for communicating data via the second channel 904.

The transmit data paths 516a,516b from the respective channels 906 and 904 are supplied to the transmit multiplexor 910 within which they communicate with a byte counter 938 and a transmit buffer 940. The transmit buffer 940 is connected by the transmit stream data path 516' to the adaptor block 501. The transmit multiplexor 910 also comprises an event generator 942 and a transmit state machine 944. The transmit state machine 944 generates the TX_REQUEST control signal 518' and TX_GRANT signals 520a,520b associated with each of the transmit data paths 516a,516b. The transmit state machine 944 receives incoming TX_REQ control signals on lines 518a,518b associated with the transmit data in channels 906 and 904, respectively. The transmit state machine 944 also receives the TX_GRANT control signal 520' associated with the transmit stream TXDATA 516'. In addition, the transmit state machine 944 receives information from, and controls, the byte counter 938, the event generator 942 and transmit buffer 940.

In order to understand operation of the receive demultiplexor 908 and transmit multiplexor 910, it is necessary to understand the protocol by which data is communicated. In this embodiment, each message is a packet consisting of a plurality of bytes. As has been described, the adaptor block 501 of the modified multi-core adaptor block 501' converts incoming serial data into parallel bytes, and converts outgoing parallel bytes into serial data. In this example, there are two types of messages that may be initiated and two types of messages which may be generated as responses. The two types of messages which may be initiated are a memory write request for writing specified data to a specified memory location, termed a "poke", and a memory read request for reading data from a specified memory location, termed a "peek". The two types of messages which may be generated as responses are a "peeked" message responding to a memory read request to return the read data and an "event" message, to be described later. The first byte of each message will be a header byte, the structure of which will differ for each of the above four message types. The header byte constitutes a packet identifier to identify the nature of the packet.

The first two bits of a header byte constitute a type identifier to identify the type of message, i.e. whether the message is a poke, a peek, a peeked, or an event message. For poke, peek and peeked messages, the following six bits of the header byte act as a length indicator to identify the number of words following the header byte and associated with that message, thus indicating the length of the packet. In an event message, four bits provide a reason indicator and two bits define a channel identifier (CI). For example, a poke message may comprise a poke header byte 00+WORDCOUNT, followed by an address word, and followed by at least one data word. Likewise, a peek message may comprise a peek header byte 01+WORDCOUNT followed by an address word and a peeked message may comprise a peeked header byte 10+WORDCOUNT followed by at least one data word. If appropriate, an event message may comprise an event header byte only, 11+CI+REASON. The operation of the three memory access messages is discussed only briefly herein because they are described in more detail in our earlier Applications, namely GB-A-9818377.5 and EP-A-840218.

Regarding the event message, the two channel identifier bits CI identify the channel on which communication is to be established on-chip. The reason code identified by the remaining four bits applies to the indicated channel. Any event message, and all following non-event messages, if any, apply to the identified channel. The initial state is channel 0, so that an initial event message is not required and the default communication, in both directions, is channel 0. An event message which changes channels is allowed to occur between a peek and its corresponding peeked message.

The operation of the receive demultiplexor 908 and transmit multiplexor 210 is described as follows. On receipt of a message RXDATA on 510' by the receive demultiplexor 908, the byte counter 914 is loaded with the number of bytes expected for each message computed from the word count extracted from the header of each message. The byte count is decremented as each byte within the message passes through. When the byte count is 0, then the next byte is a header. The event detector 912 looks at each byte and decodes the channel identifier. The receive state machine 920 observes the output from the byte counter 914 and the event detector 912 and determines from the channel identifier the channel (i.e. channel 0 or channel 1) for this and subsequent messages. According to the identified channel, it controls passage of the message either to the first receive buffer 916 or the second receive buffer 918 and connects the control signals 512',514' with the control signals of the appropriate channel. Thus, if the channel identifier or channel number denotes channel 0 indicated by numeral 906, then the control signals 512',514' are connected to lines 512a and 514a, respectively. The message is placed into the first receive buffer 916 and output via data path 510a for communication via channel 0.

The transmit multiplexor passes the channel stream data TXDATA from whichever channel is communicating to the transmit stream 516' and connects together the corresponding control signals. It also inserts an event packet when the communicating channel changes. If both channels have data available for transmission, the messages from each are sent alternately.

The byte counter 938 is loaded with the number of bytes expected for each message computed from the word count extracted from the header of each message. The byte counter 938 is decremented as each byte within the message passes through. When the byte count is 0, then the next byte is a header. The transmit state machine 944 connects the control signals of the communicating channel with the transmit control signals 518',520'. Thus, for example, if channel 0 is communicating, the signal 518a is connected to the control signal 518' and the signal 520a is connected to the control signal 520' by the transmit state machine 944. It will be apparent that the output signals of modified adaptor block 501', namely those on lines 512a,510a,514a and 512b,510b and 514b of FIG. 10 correspond, for respective channels 906,904, to the signal lines 512,510 and 514 shown between adaptor block 501 and the receive/transmit storage blocks 502,504 of FIG. 4. The signals from modified adaptor block 501' are supplied, via the receive demultiplexor 908 and transmit multiplexor blocks, to the respective receive/transmit storage blocks of each channel.

The transmit state machine 944 also determines when there is to be a change in the communicating channel. To effect that change, the transmit state machine 944 switches over connection of the control signals to the control signals of the other channel (or another channel if there are more than two communicating channels) and triggers the event generator 942 to generate an event packet identifying the channel to which communication has just been switched. That event packet identifies the channel in the CI bits 6 and 7 mentioned hereinbefore, and identifies as a reason in bits 2 to 5 that there has been a channel change. The generated event packet is launched via the transmit data path 516' after all bytes of the message currently being conveyed on the first communicating channel have been conveyed, as determined by the byte counter 938.

For example, for messages initiated on-chip and transmitted off-chip, an event packet defining channel 0 may be launched first, followed by a poke message and a peek message all communicated via channel 0. Then, the communicating channel may be switched to channel 1 and this would be indicated by an event packet denoting channel 1. This is followed by a peek message on channel 1. It will readily be apparent that the messages which follow the channel changing event message are exemplary only. Thus, FIG. 10 illustrates a synchronous multi-core data adaptor 90' in which receive demultiplexing circuitry and transmit multiplexing circuitry, in combination with receive and transmit storage block elements, permit synchronous communication with a plurality of different source/destination logic elements on-chip.

Preferred multi-core data adaptors 90' can establish a connection between independent debugger hosts located off-chip and independent on-chip source/destination processing cores. Environments using multi-core data adaptors 90 are described more fully in British patent application No. 9818377.5, which is incorporated herein by reference.

For example that application discloses arrangements which allow independent debugging operations to be carried out between a number of host CPU and respective independent processing cores by virtue of independent communication channels.

In general, the systems described herein allow the following diagnostic features to be provided independently between each off-chip debugger application and each on-chip processing core. It provides the facility to implement real time diagnostic procedures, that is while the target CPU is operating in real time and without intruding on its operation while the diagnostic procedures are taking place—in particular, monitoring of the memory bus and accesses to the target memory can be undertaken by the host CPU without involving the target CPU of that on-chip processing core. The system further allows accesses to target memory and configuration registers from hosts, access to the host memory from the target CPU and control of the target CPU and sub-systems, including the facility to effect booting operations of the target CPU from the host processor.

Referring to FIG. 1, the structure thereof may be adapted by removal of the memory cache 302 and connection of the common bus 312 and the CPU instruction-fetch bus 314 directly to the memory bus 166. Furthermore, the structure could be adapted to include an additional master, or on-chip autonomous functionality connected to the memory bus 166. Still further, the target CPU 162 may be removed, and the memory slave bus 220, the memory master bus 222, and the memory monitor bus 226 connected directly to the memory bus 166.

What is claimed is:

1. An integrated circuit comprising:
  (a) a serial data input pin and a serial data output pin;
  (b) on-chip functional circuitry and test logic;
  (c) a test access port controller connected to effect communication of serial data across the integrated circuit boundary via the serial data input pin and the serial data output pin, the test access port controller being connectable to the test logic in a first mode of operation to effect communication of serial test data off-chip of the integrated circuit; and
  (d) a data adaptor which is connectable to the serial data input pin and the serial data output pin via the test access port controller in a second mode of operation wherein the data adaptor comprises:
    a first interface for communicating data in the form of serial bits to and from the test access port controller under control of a first clock signal;
    a second interface for communicating data in the form of successive sets of parallel data and control signals to aid from the on-chip functional circuitry under control of a second lock signal generated independently of the first clock signal; and
    a data store for holding data received in the data adaptor to take into account differences between the first clock signal and the second clock signal.

2. The integrated circuit according to claim 1, wherein the data store comprises a receive data storage unit operable to store data received from off-chip of the integrated circuit via the test access port controller and supply the data in a direction of the on-chip functional circuitry under control of the second clock signal.

3. The integrated circuit according to claim 2, wherein the data store comprises a transmit data storage unit to store data transmitted from the on-chip functional circuitry and received by the data store under control of the second clock signal.

4. The integrated circuit according to claim 3, wherein each data storage unit comprises a register providing at least one storage location.

5. The integrated circuit according to claim 3, wherein each data storage unit comprises a dual port memory having a plurality of addressable storage locations, a first memory access circuitry operating under control of the first clock signal and a second memory access circuitry operating under control of the second clock signal.

6. The integrated circuit according to claim 1, wherein the data adaptor comprises an error detector for detecting an error condition to prevent communication of subsequent data until the error condition has been removed.

7. The integrated circuit according to claim 1, wherein the on-chip functional circuit includes a plurality of processing cores and wherein the data adaptor has multiplexing circuitry and demultiplexing circuitry for communicating with said processing cores by respective communication channels.

8. A computer system comprising:
  (a) an integrated circuit including:
    a target processor;
    an on-chip bus system connected to the target processor;
    functional circuitry connected to said on-chip bus system;
    a test access port controller connected to a serial data input pin and a serial data output pin for effecting communication of serial data across the integrated circuit boundary; and
    a first data adaptor which is connectable to the serial data input pin and the serial data output pin via the test access port controller, wherein the first data adaptor comprises:
      a first interface for communicating data in the form of serial bits to and from the test access port controller under control of a first clock signal;
      a second interface for communicating data in the form of successive sets of parallel data and control signals to and from said on-chip functional circuitry under control of a second clock signal generated independently of the first clock signal; and
      a data store for holding data received in the first data adaptor to take into account differences between the first clock signal and the second clock signal;
  (b) an off-chip host processor operable to generate and receive parallel data and control signals; and
  (c) a second and off-chip data adaptor connected to the off-chip host processor to receive the parallel data and control signals from the off-chip host processor and to convert them into a first sequence of serial bits for transmission onto the integrated circuit via the serial data input pin, and to receive a second sequence of serial bits from the serial data output pin and to convert said second sequence into parallel data and control signals to said off-chip host processor, whereby the off-chip host processor can communicate with said functional circuitry via said on-chip bus system without involvement of the target processor.

* * * * *